(12) United States Patent
Lin et al.

(10) Patent No.: US 11,601,117 B1
(45) Date of Patent: Mar. 7, 2023

(54) SENSE AMPLIFIER FOR COUPLING EFFECT REDUCTION

(71) Applicant: Taiwan Semiconductor Manufacturing Company, Ltd., Hsinchu (TW)

(72) Inventors: Ku-Feng Lin, Hsinchu (TW); Jui-Che Tsai, Hsinchu County (TW); Perng-Fei Yuh, Walnut Creek, CA (US); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/407,451

(22) Filed: Aug. 20, 2021

(51) Int. Cl.
| | | |
|---|---|---|
| G11C 7/06 | (2006.01) | |
| H03K 3/356 | (2006.01) | |
| H03K 3/037 | (2006.01) | |
| H01L 27/06 | (2006.01) | |

(52) U.S. Cl.
CPC ............ *H03K 3/037* (2013.01); *G11C 7/065* (2013.01); *H01L 27/0629* (2013.01); *H03K 3/35613* (2013.01)

(58) Field of Classification Search
CPC ................... H03K 3/35613; H03K 3/356139
See application file for complete search history.

(56) References Cited

U.S. PATENT DOCUMENTS

| | | | | |
|---|---|---|---|---|
| 4,493,056 | A * | 1/1985 | Mao | G11C 11/404 257/306 |
| 8,624,632 | B2 * | 1/2014 | Bulzacchelli | H03K 3/356139 327/212 |

\* cited by examiner

*Primary Examiner* — Patrick O Neill
(74) *Attorney, Agent, or Firm* — Merchant & Gould P.C.

(57) ABSTRACT

A sense amplifier including a first input transistor having a first input gate and a first drain/source terminal, a second input transistor having a second input gate and a second drain/source terminal, a latch circuit, and a first capacitor. The latch circuit includes a first latch transistor having a third drain/source terminal connected to the first drain/source terminal and a second latch transistor having a fourth drain/source terminal connected to the second drain/source terminal. The first capacitor is connected on one side to the first input gate and on another side to the fourth drain/source terminal to reduce a coupling effect in the sense amplifier.

19 Claims, 13 Drawing Sheets

SENSE AMPLIFIER FOR COUPLING EFFECT REDUCTION

BACKGROUND

Memory circuits, such as magneto-resistive random-access memory (MRAM) circuits, include sense amplifiers for reading data stored in them. Often, a sense amplifier includes two symmetrical inputs for reading the state of a memory cell. One input is a data input Q that receives the data from the memory cell and the other input is a reference input QB. The voltage level on the data input Q is compared to the voltage level on the reference input QB to determine the state of the memory cell and the data output. The difference in voltage levels on the data input Q and the reference input QB is referred to as the read margin. Ideally, the voltage level on the reference input QB is in the middle, between the voltage levels for a 0 and a 1 on the data input Q. However, in some sense amplifier circuits, the reference input QB is directly coupled to the data input Q, such that the voltage level on the reference input QB is changed by the voltage levels on one or more of the data inputs Q. This changes the read margin and, in some situations, reduces the read margin. Also, in some sense amplifiers, the data input Q and/or the reference input QB is in-directly coupled to an internal node of the sense amplifier, such that the voltage levels on the data input Q and/or the reference input QB are changed during operation of the sense amplifier, reducing the read margin. These reductions in the read margin can lead to incorrectly reading data from the memory and reducing the reliability of the memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
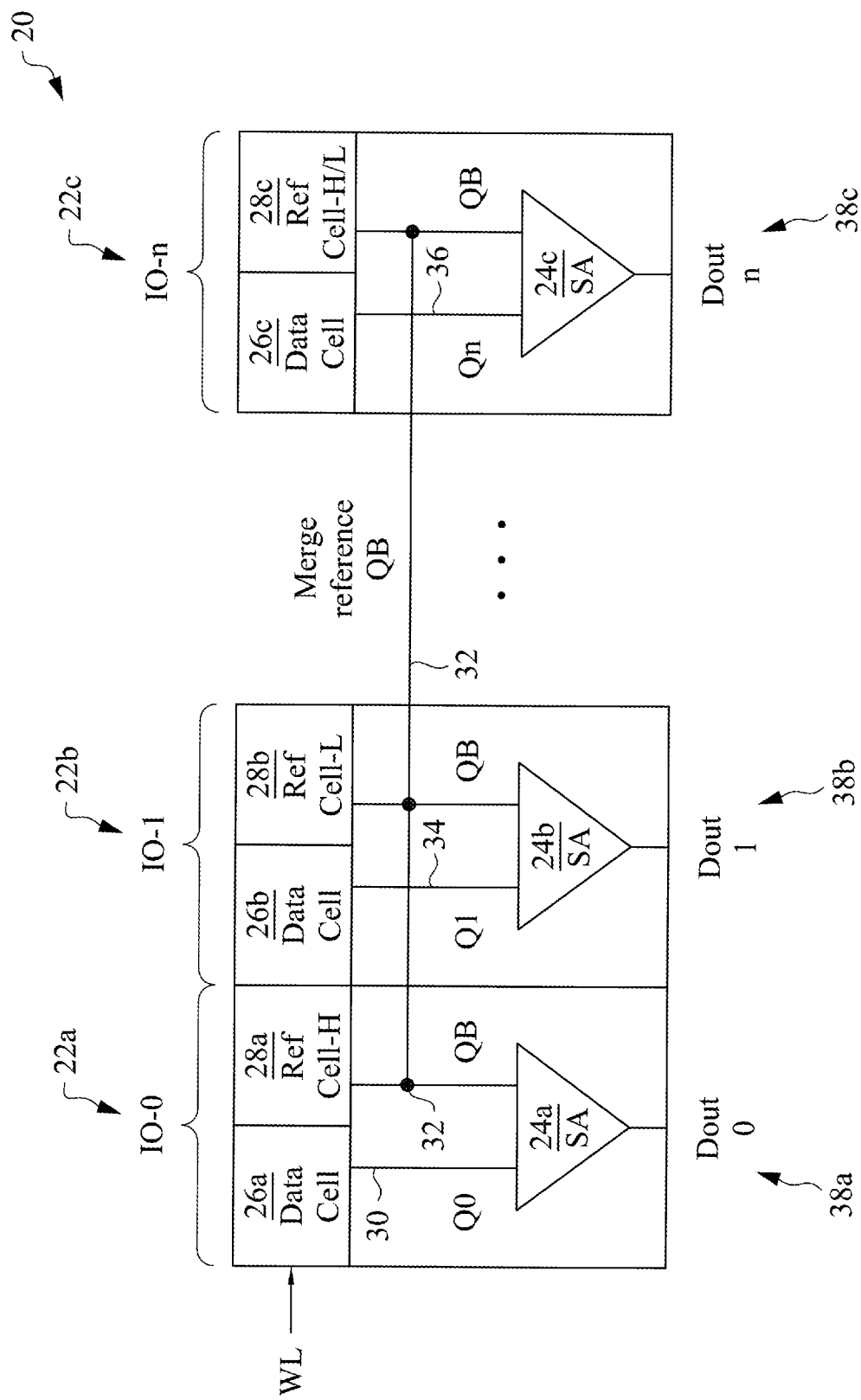
FIG. 1 is a diagram schematically illustrating a portion of a memory circuit that includes n+1 input/output (IO) cells, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory circuits, such as MRAM circuits, include sense amplifiers for reading the data stored in them. In some sense amplifier circuits, the reference input QB is directly coupled to the data input Q, such that the voltage level on the reference input QB is changed by the voltage levels on one or more of the data inputs Q. In some sense amplifier circuits, the data input Q and/or the reference input QB are in-directly coupled to an internal node of the sense amplifier, such that the voltage levels on the data input Q and/or the reference input QB are changed during operation of the sense amplifier. This direct coupling and in-direct coupling can reduce the read margin, which leads to incorrectly reading data from the memory and reducing the reliability of the memory.

Disclosed embodiments are directed to a sense amplifier that provides little or no direct coupling effect between the data input Q and the reference input QB and that reduces the in-direct coupling effect on the data input Q and the reference input QB from internal nodes of the sense amplifier. The absence of direct coupling and the reduction in the in-direct coupling improves the read margin and the reliability of the memory. In some embodiments, the improvement in the in-direct coupling effect is provided with little or no impact on the layout area of the circuit and, in some embodiments, the improvement in the indirect coupling effect is greater than 80 percent.

In some embodiments, the sense amplifier includes a first input transistor having a data input QB at its gate and a second input transistor having a reference input QB at its gate. The first and second input transistors are connected to a latch circuit, with the drain/source path of the first input transistor connected to the drain/source path of a first latch transistor, and the drain/source path of the second input transistor connected to the drain/source path of a second latch transistor. The first input transistor includes an internal coupling capacitor from its gate to the drain/source connection with the first latch transistor, which provides a negative in-direct coupling effect on the data input Q. The second input transistor includes an internal coupling capacitor from its gate to the drain/source connection with the second latch transistor, which provides a negative in-direct coupling effect on the reference input QB. To offset or reduce the negative in-direct coupling effects from these internal coupling capacitors, the sense amplifier includes cross-coupled capacitors that provide positive coupling effects on the data input Q and the reference input QB.

In some embodiments of the cross-coupled capacitors, a first capacitor is connected on one side to the data input Q and on another side to the drain/source connection between the second input transistor and the second latch transistor, and a second capacitor is connected on one side to the reference input QB and on another side to the drain/source connection between the first input transistor and the first latch transistor. The cross-coupled capacitors provide positive coupling effects to the data input Q and the reference input QB that reduce the negative in-direct coupling effects.

In some embodiments, the cross-coupled capacitors include at least one of a front-end-of-line (FEOL) capacitor, a middle-end-of-line (MEOL) capacitor, and a back-end-of-line (BEOL) capacitor. In some embodiments, a FEOL capacitor includes a metal-oxide-semiconductor field-effect transistor (mosfet) having its drain and source connected at one terminal and its gate at another terminal. In some embodiments, a MEOL capacitor includes at least one of a metal over diffusion (MD) to MD capacitor, a polycrystalline silicon gate (poly-gate) to poly-gate capacitor, a polycrystalline silicon on oxide diffusion edge (PODE) to poly-gate capacitor, a PODE to MD capacitor, and an isolation polycrystalline silicon gate (ISO-gate) to MD capacitor. In some embodiments, a BEOL capacitor includes at least one of a metal to metal capacitor and metal, such as second layer metal M1 and/or third layer metal M2, coupled to one or more of the MEOL structures. Using the FEOL, MEOL, and BEOL capacitors, including the PODE and ISO-gate structures that are already in the integrated circuit, results in little or no layout area increases for the sense amplifier.

FIG. 1 is a diagram schematically illustrating a portion of a memory circuit 20 that includes n+1 IO cells (IO-0 through IO-n), in accordance with some embodiments. The memory circuit 20 includes IO-0 cell 22*a*, IO-1 cell 22*b*, and other IO cells through IO-n cell 22*c*. Each of the IO cells 22*a*-22*c* includes a sense amplifier 24*a*-24*c*, respectively, that is configured to provide little or no direct coupling between the data input Qx (of Q0-Qn) and the reference input QB and that reduces the in-direct coupling of the data input Qx and the reference input QB from internal nodes of the sense amplifier. In some embodiments, the memory circuit 20 is part of an MRAM circuit.

The data IO cells 22*a*, 22*b*, and 22*c* include the sense amplifiers 24*a*, 24*b*, and 24*c* electrically coupled to memory data cells 26*a*, 26*b*, and 26*c*, respectively, and to memory reference cells 28*a*, 28*b*, and 28*c*, respectively. Sense amplifier 24*a* includes data input Q0 electrically coupled to data cell 26*a* by conductive path 30, and reference input QB electrically coupled to reference cell 28*a* by conductive path 32. Sense amplifier 24*b* includes data input Q1 electrically coupled to data cell 26*b* by conductive path 34, and reference input QB electrically coupled to reference cell 28*b* by conductive path 32. This continues through sense amplifier 24*c* that includes data input Qn electrically coupled to data cell 26*c* by conductive path 36, and reference input QB electrically coupled to reference cell 28*c* by conductive path 32.

The reference input QB is a merged reference input QB, such that the reference inputs QB of the n+1 data IO cells 22*a*-22*c* are electrically connected by conductive path 32 to provide the merged reference input QB. In some embodiments, the reference cells 28*a*-28*c* provide alternating high and low reference cell voltages to the merged reference input QB. For example, reference cell 28*a* provides a high reference cell voltage to the merged reference input QB and reference cell 28*b* provides a low reference cell voltage to the merged reference input QB. The alternating high and low reference cell voltages continue through reference cell 28*c* for providing the merged reference input QB. Ideally, to provide a maximum read margin, the merged reference input QB has a voltage level that is in the middle, between a high memory data cell voltage level and a low memory data cell voltage level.

In operation, each of the sense amplifiers 24*a*-24*c* compares the data input Qx to the merged reference input QB and provides a data output Dout. For example, sense amplifier 24*a* compares the data input Q0 from data cell 26*a* to the merged reference input QB and provides the sensed output value Dout 0 at 38*a*, sense amplifier 24*b* compares the data input Q1 from data cell 26*b* to the merged reference input QB and provides the sensed output value Dout 1 at 38*b*, and so on, through sense amplifier 24*c* comparing the data input Qn from data cell 26*c* to the merged reference input QB and providing the sensed output value Dout n at 38*c*.

The sense amplifiers 24*a*-24*c* of the memory circuit 20 provide little or no direct coupling between the data inputs Q0-Qn and the merged reference input QB. However, if the memory circuit 20 otherwise has direct coupling between the data inputs Q0-Qn and the merged reference input QB, read margins will be degraded or reduced, especially with a merged reference input QB.

Figure 2:
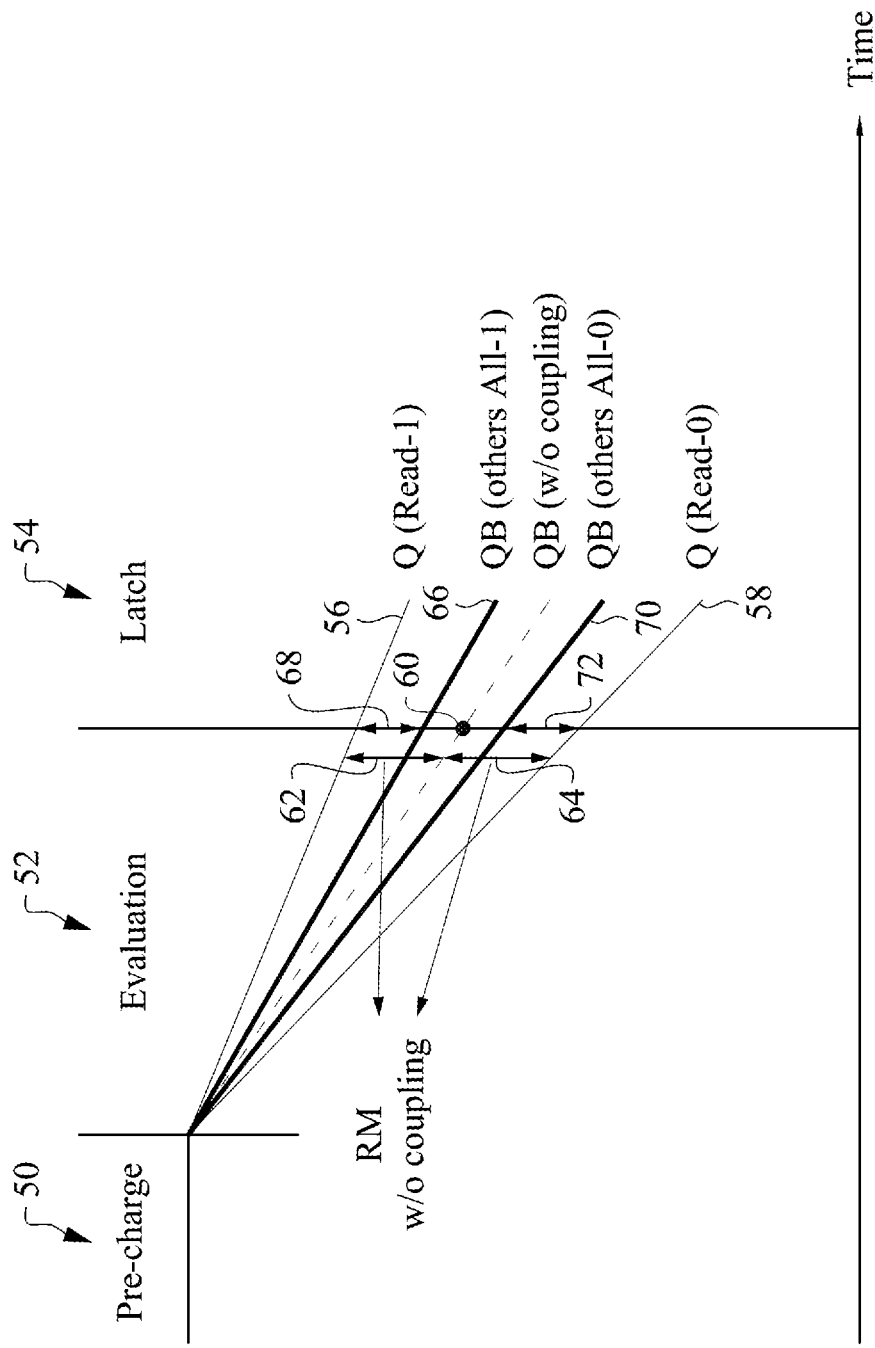
FIG. 2 is a graph diagram illustrating read margin degradation due to direct coupling between the data inputs Q0-Qn and the merged reference input QB in the memory circuit, in accordance with some embodiments.

FIG. 2 is a graph diagram illustrating read margin degradation due to direct coupling between the data inputs Q0-Qn and the merged reference input QB in the memory circuit 20, in accordance with some embodiments. In this example, sense amplifier 24*a* and connected components are referenced, however, the ideas apply to all the sense amplifiers 24*a*-24*c* and connected components.

In operation, sense amplifier 24*a* has a pre-charge phase 50, an evaluation phase 52, and a latch phase 54. In the pre-charge phase 50, nodes in the sense amplifier 24*a* are charged to correct voltages for reading data from the data cell 26*a*. Next, in the evaluation phase 52, the voltage level of the data from the data cell 26*a* is connected to the pre-charged data input Q0, and the voltage levels from the reference cells 28a-28c are connected to the merged reference input QB. If the data stored in the data cell 26 is a high voltage, then the data input Q0 will be driven toward a high voltage level 56 for reading a 1, and if the data stored in the data cell 26a is a low voltage, then the data input Q0 will be driven toward a low voltage level 58 for reading a 0. At the latch phase 54, the sense amplifier 24a is activated and the voltage on the data input Q0 is compared to the voltage on the merged reference input QB to determine the data output Dout 0 at 38a.

In an ideal situation, without direct coupling between the data inputs Q0-Qn and the merged reference input QB, the voltage on the merged reference input QB is in the middle 60, between the high voltage level 56 and the low voltage level 58 of the data input Q0. In this situation, the read margin without direct coupling for reading a 1 at 62 is equal to the read margin without direct coupling for reading a 0 at 64.

However, with at least some direct coupling between the data inputs Q0-Qn and the merged reference input QB, the voltage on the merged reference input QB may be changed from the voltage in the middle 60 to another voltage that reduces one or more of the read margins 62 and 64. For example, if data input Q0 is directly coupled to the merged reference input QB, and data input Q1 is directly coupled to the merged reference input QB, and so on, through data input Qn being directly coupled to the merged reference input QB, then the voltages on all the data inputs Q0-Qn influence the voltage on the merged reference input QB. In one worst-case scenario, the read margin for reading a 1 is minimized if all the data inputs Q0-Qn are high voltage levels, which pull the voltage on the merged reference input QB to a higher voltage level 66 and reduces the read margin for reading a 1 to the read margin 68, as compared to the read margin without direct coupling for reading a 1 at 62. Also, in another worst-case scenario, the read margin is minimized if all the data inputs Q0-Qn are all low voltage levels, which pull the voltage on the merged reference input QB to a lower voltage level 70 and reduces the read margin for reading a 0 to the read margin 72, as compared to the read margin without coupling for reading a 0 at 64.

Thus, it is important to have sense amplifiers 24a-24c that contribute little or no direct coupling between the data inputs Q0-Qn and the merged reference input QB. Also, it is important to reduce in-direct coupling that degrades read margins, such as negative in-direct coupling from internal nodes of the sense amplifiers 24a-24c to the data inputs Q0-Qn and the merged reference input QB.

Figure 3:
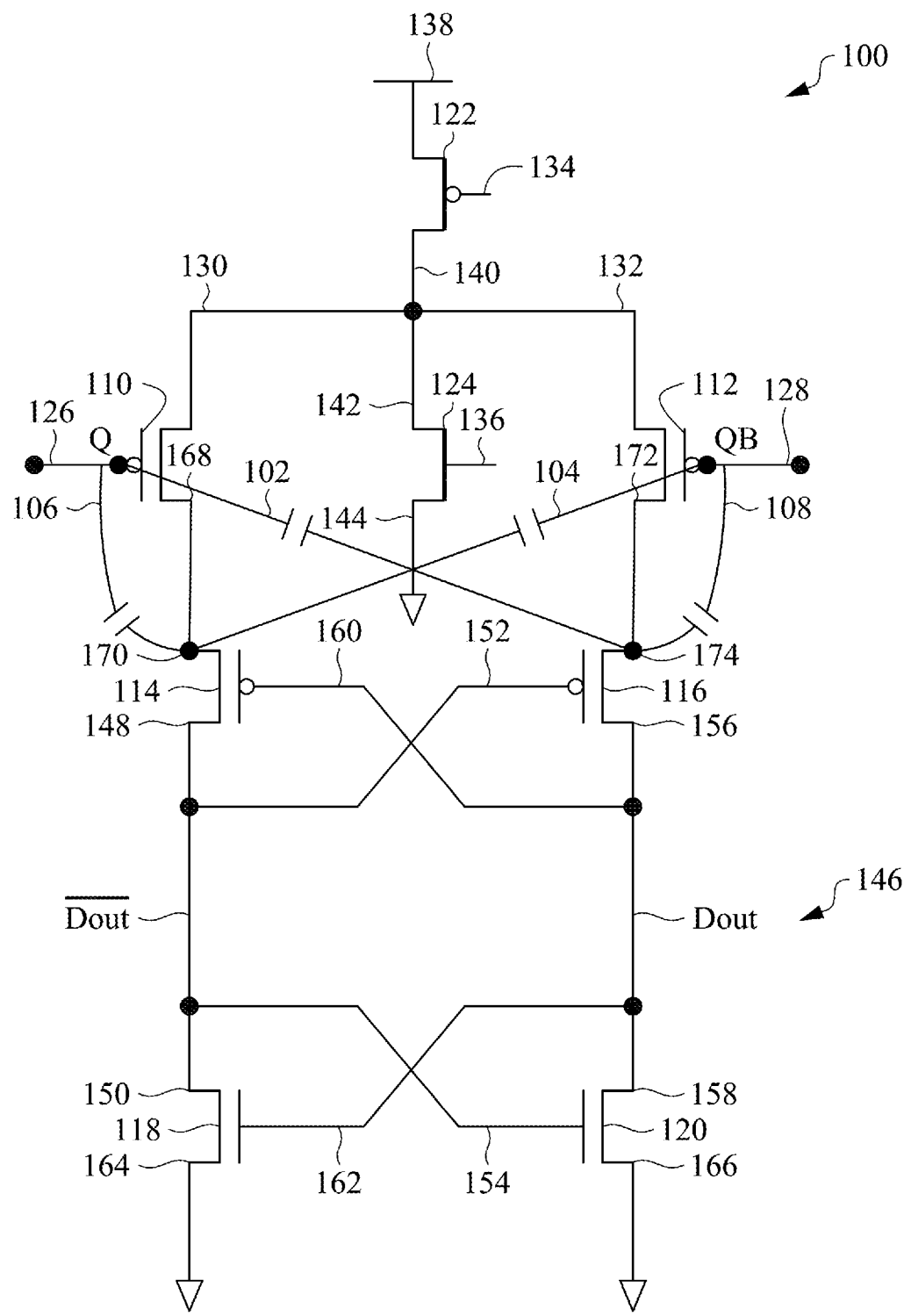
FIG. 3 is a diagram schematically illustrating a sense amplifier, in accordance with some embodiments.

FIG. 3 is a diagram schematically illustrating a sense amplifier 100, in accordance with some embodiments. The sense amplifier 100 contributes little or no direct coupling between the data input Q and the merged reference input QB. Also, the sense amplifier 100 includes positive cross-coupled capacitors 102 and 104 that offset or reduce negative in-direct coupling caused by internal gate-to-drain capacitors Cgd 106 and 108, where the negative in-direct coupling is from internal nodes of the sense amplifier 100 to the data input Q and to the reference input QB. In some embodiments, the sense amplifier 100 is like one or more of the sense amplifiers 24a-24c, shown in FIG. 1. In some embodiments, at least one of the internal capacitors 106 and 108 is a gate-to-source capacitor.

The sense amplifier 100 includes a first input transistor 110, a second input transistor 112, a first latch transistor 114, a second latch transistor 116, a third latch transistor 118, and a fourth latch transistor 120. Each of the first input transistor 110, the second input transistor 112, the first latch transistor 114, and the second latch transistor 116 is a p-channel metal-oxide semiconductor (PMOS) transistor and each of the third latch transistor 118 and the fourth latch transistor 120 is an n-channel metal-oxide semiconductor (NMOS) transistor. The sense amplifier 100 further includes a first PMOS enable transistor 122 and a second NMOS enable transistor 124.

The first input transistor 110 has a gate 126 that receives the data input Q from a memory data cell and the second input transistor 112 has a gate 128 that receives the reference input QB, such as the merged reference input QB. One side of the first input transistor's drain/source path is connected at drain/source terminal 130 to one side of the second input transistor's drain/source path at drain/source terminal 132. Also, the first enable transistor 122 has a gate 134 that receives an enable signal and the second enable transistor 124 has a gate 136 that receives the enable signal. In addition, one side of the first enable transistor's drain/source path is connected at drain/source terminal 138 to power and the other side of the first enable transistor's drain/source path is connected at drain source terminal 140 to the drain/source terminals 130 and 132. Further, one side of the second enable transistor's drain/source path is connected at drain/source terminal 142 to the drain/source terminals 130, 132, and 140 and the other side of the second enable transistor's drain/source path is connected at drain/source terminal 144 to a reference, such as ground.

The sense amplifier 100 includes a cross-coupled latch circuit 146 that includes the first latch transistor 114, the second latch transistor 116, the third latch transistor 118, and the fourth latch transistor 120. One side of the first latch transistor's drain/source path is connected at drain/source terminal 148 to one side of the third latch transistor's drain/source path at drain/source terminal 150 and to a gate 152 of the second latch transistor 116 and a gate 154 of the fourth latch transistor 120. One side of the second latch transistor's drain/source path is connected at drain/source terminal 156 to one side of the fourth latch transistor's drain/source path at drain/source terminal 158 and to a gate 160 of the first latch transistor 114 and a gate 162 of the third latch transistor 118. The other side of the third latch transistor's drain/source path is connected at drain/source terminal 164 to a reference, such as ground, and the other side of the fourth latch transistor's drain/source path is connected at drain/source terminal 166 to a reference, such as ground.

The other side of the first input transistor's drain/source path is connected at drain/source terminal 168 to the other side of the first latch transistor's drain/source path at drain/source terminal 170. Also, the other side of the second input transistor's drain/source path is connected at drain/source terminal 172 to the other side of the second latch transistor's drain/source path at drain/source terminal 174.

The sense amplifier 100 further includes the positive feedback cross-coupled capacitor 102 connected on one side to the gate 126 of the first input transistor 110 and on the other side to the drain/source terminals 172 and 174 of the second input transistor 112 and the second latch transistor 116, respectively. The positive feedback cross-coupled capacitor 104 connected on one side to the gate 128 of the second input transistor 112 and on the other side to the drain/source terminals 168 and 170 of the first input transistor 110 and the first latch transistor 114, respectively. Also, the first input transistor 110 includes the internal gate-to-drain capacitor Cgd 106 between the gate 126 and the drain/source terminal 168, and the second input transistor 112 includes the internal gate-to-drain capacitor Cgd 108 between the gate 128 and the drain/source terminal 172.

In operation, in the pre-charge phase, nodes of the sense amplifier 100 are charged to voltages for reading the data from a data cell at data input Q. In the pre-charge phase, the sense amplifier is disabled, where the enable signal at the gates 134 and 136 of the first and second enable transistors 122 and 124, respectively, is at a high voltage level, which pulls the node at the drain/source terminal 142 to a low voltage, such as the reference voltage. Also, the gate 126 of the first input transistor 110 and the gate 128 of the second input transistor 112 is charged to a high voltage level and, in some embodiments, the gates 160, 152, 162, and 154 of the latch transistors 114, 116, 118, and 120, respectively, are charged to a low voltage level.

Next, in the evaluation phase, the data cell of interest is addressed and the voltage level of the data cell is connected to the pre-charged data input Q. Also, the voltage level from the merged reference cells are connected to the pre-charged reference input QB. If the voltage level from the data cell is a high voltage level, then the data input Q will be driven toward a higher voltage level, such as for reading a 1, and if the voltage level from the data cell is a low voltage level, then the data input Q will be driven toward a low voltage level, such as for reading a 0. In the evaluation phase, one of the data input Q and the reference input QB is lower in voltage than the other one of the data input Q and the reference input QB, such that the one of the input transistors 110 and 112 that receives the lower voltage will be turned on more than the one of the input transistors 110 and 112 that receives the higher voltage, after the sense amplifier 100 is enabled.

In the latch phase, the enable signal at the gates 134 and 136 of the first and second enable transistors 122 and 124, respectively, is switched from a high voltage level to a low voltage level to turn on first enable transistor 122 and turn off second enable transistor 124. This activates the sense amplifier 100, such that the sense amplifier 100 compares the voltage on the data input Q to the voltage on the merged reference input QB to determine the data output Dout. In the latch phase, one of the data input Q and the reference input QB is lower in voltage than the other one of the data input Q and the reference input QB, and the one of the input transistors 110 and 112 that receives the lower voltage is turned on more than the one of the input transistors 110 and 112 that receives the higher voltage.

As a result, one of the drain/source terminals 168 and 172 of the first and second input transistors 110 and 112, respectively, is charged to a higher voltage faster than the other one. The one of the drain/source terminals 168 and 172 that is charged faster, provides a higher feedback voltage to the input gate of the transistor through its gate-to-drain capacitor, such that the feedback voltage is negative feedback that raises the lower voltage at the gate and reduces the read margin between the gates 126 and 128 of the first and second input transistors 110 and 112. Also, on the other side of the sense amplifier 100, the one of the drain/source terminals 168 and 172 that is charged slower, provides a lower feedback voltage to the input gate of the transistor through its gate-to-drain capacitor, such that the feedback voltage is negative feedback that lowers the higher voltage at the gate and reduces the read margin between the gates 126 and 128 of the first and second input transistors 110 and 112.

To offset or reduce the effect of this negative coupling through the gate-to-drain capacitors 106 and 108, the cross-coupled capacitors 102 and 104 provide positive feedback voltages, i.e., positive coupling, to the gates 126 and 128 of the first and second input transistors 110 and 112. The one of the drain/source terminals 168 and 172 that is charged faster, provides the higher feedback voltage to the input gate of the opposite input transistor through the corresponding one of the cross-coupled capacitors 102 and 104, such that the feedback voltage is a positive feedback that raises the higher voltage at the gate and increases the read margin between the gates 126 and 128 of the first and second input transistors 110 and 112. Also, on the other side of the sense amplifier 100, the one of the drain/source terminals 168 and 172 that is charged slower, provides the lower feedback voltage to the input gate of the opposite input transistor through the other one of the cross-coupled capacitors 102 and 104, such that the feedback voltage is positive feedback that lowers the lower voltage at the gate and increases the read margin between the gates 126 and 128 of the first and second input transistors 110 and 112.

Further, in the latch phase, with the gates 160, 152, 162, and 154 of the latch transistors 114, 116, 118, and 120, respectively, charged to a low voltage level, the first and second latch transistors 114 and 116 are turned on or biased on and the third and fourth latch transistors 118 and 120 are turned off or biased off. The one of the drain/source terminals 168 and 172 that is charged faster, provides the higher voltage through the corresponding one of the first and second latch transistors 114 and 116, which biases off the other one of the first and second latch transistors 114 and 116 and biases on the corresponding one of the third and fourth latch transistors 118 and 120. This, in turn, lowers or maintains the lower voltage at the gate of the one of the first and second latch transistors 114 and 116 that is biased on and transmitting the higher voltage from the one of the drain/source terminals 168 and 172 that is charged faster and it lowers or maintains the lower voltage at the gate of the corresponding third and fourth latch transistor 118 and 120 to latch in the voltage level of the data cell.

In a memory including sense amplifier 100, factors that can negatively impact the read margin include: data patterns, such as all 0s or all 1s, on data inputs Q changing the merged reference input QB as described above in relation to direct coupling; a capacitance ratio of the gate-to-drain capacitance Cgd divided by a gate capacitance Cg at the gate of the input transistor, where a higher capacitance ratio results in a larger in-direct negative coupling problem, and the voltage swing difference between the voltages at the drain/source terminals 168 and 170 and the voltages at the drain/source terminals 172 and 174, which affects the in-direct negative coupling problem through the internal capacitances 106 and 108. In some embodiments, the internal capacitances 106 and 108 can be gate-to-source capacitances.

By way of example, in the latch phase, if the voltage on the data input Q is lower than the voltage on reference input QB, the first input transistor 110 turns on more than the second input transistor 112, which charges the drain/source terminals 168 and 170 faster than the drain/source terminals 172 and 174. Due to in-direct coupling through the internal gate-to-drain capacitor Cgd 106, the higher voltage at the drain/source terminals 168 and 170 is fed back through the internal gate-to-drain capacitor Cgd 106 to the gate 126 of the first input transistor 110. This in-direct coupling raises the voltage of the data input Q on the gate 126, which negatively impacts or reduces the read margin between the voltage of the data input Q and the voltage at the reference input QB. Also, due to in-direct coupling through the internal gate-to-drain capacitor Cgd 108, the lower voltage at the drain/source terminals 172 and 174 is fed back through the internal gate-to-drain capacitor Cgd 108 to the gate 128 of the second input transistor 112, which may lower the voltage of the reference input QB on the gate 128 and further negatively impact or reduce the read margin between the voltage at the data input Q and the voltage at the reference input QB.

In this example, the higher voltage at the drain/source terminals 168 and 170 is cross-coupled to the gate 128 of the second input transistor 112 to raise or maintain the higher voltage at the reference input QB. Also, the lower voltage on the drain/source terminals 172 and 174 is cross-coupled to the gate 126 of the first input transistor 110 to lower or maintain the lower voltage at the data input Q. Thus, the cross-coupled capacitors 102 and 104 provide positive coupling to the gates 126 and 128 of the first and second input transistors 110 and 112 to increase or maintain the read margin for reading data from the data cell.

Further, in this example, with the gates 160, 152, 162, and 154 of the latch transistors 114, 116, 118, and 120, respectively, charged to a low voltage level, the first and second latch transistors 114 and 116 are turned on or biased on and the third and fourth latch transistors 118 and 120 are turned off or biased off. The higher voltage at the drain/source terminals 168 and 170 is provided through the first latch transistor 114, which biases off the second latch transistor 116 and biases on the fourth latch transistor 120. This, in turn, lowers or maintains the lower voltage at the gate 160 of the first latch transistor 114 and at the gate 162 of the third latch transistor 118 to latch in the data from the data cell.

Alternatively, by way of example, in the latch phase, if the voltage on the data input Q is higher than the voltage on the reference input QB, the first input transistor 110 turns off more than the second input transistor 112, which charges the drain/source terminals 172 and 174 faster than the drain/source terminals 168 and 170. Due to in-direct coupling through the internal gate-to-drain capacitor Cgd 108, the higher voltage at the drain/source terminals 172 and 174 is fed back through the internal gate-to-drain capacitor Cgd 108 to the gate 128 of the second input transistor 112. This in-direct coupling can raise the voltage at the reference input QB on the gate 128, which negatively impacts or reduces the read margin between the voltage of the data input Q and the voltage at the reference input QB. Also, due to in-direct coupling through the internal gate-to-drain capacitor Cgd 106, the lower voltage at the drain/source terminals 168 and 170 is fed back through the internal gate-to-drain capacitor Cgd 106 to the gate 126 of the first input transistor 110, which may lower the voltage at the data input Q on the gate 126 and further negatively impact or reduce the read margin between the voltage at the data input Q and the voltage at the reference input QB.

In this example, the higher voltage at the drain/source terminals 172 and 174 is cross-coupled to the gate 126 of the first input transistor 110 to raise or maintain the higher voltage at the data input Q. Also, the lower voltage on the drain/source terminals 168 and 170 is cross-coupled to the gate 128 of the second input transistor 112 to lower or maintain the lower voltage at the reference input QB. Thus, the cross-coupled capacitors 102 and 104 provide positive coupling to the gates 126 and 128 of the first and second input transistors 110 and 112 to increase or maintain the read margin for reading data from the data cell.

Further, in this example, with the gates 160, 152, 162, and 154 of the latch transistors 114, 116, 118, and 120, respectively, charged to a low voltage level, the first and second latch transistors 114 and 116 are turned on or biased on and the third and fourth latch transistors 118 and 120 are turned off or biased off. The higher voltage at the drain/source terminals 172 and 174 is provided through the second latch transistor 116, which biases off the first latch transistor 114 and biases on the third latch transistor 118. This, in turn, lowers or maintains the lower voltage at the gate 152 of the second latch transistor 116 and at the gate 154 of the fourth latch transistor 120 to latch in the data from the data cell.

Thus, the sense amplifier 100 provides little or no direct coupling between the data input Q and the reference input QB and the sense amplifier 100 reduces in-direct coupling between the data input Q and the reference input QB and internal nodes of the sense amplifier 100. The absence of direct coupling and the reduction in the in-direct coupling improves the read margins and the reliability of the memory. In some embodiments, the improvement in the in-direct coupling effect is provided with little or no impact on the layout area of the circuit and, in some embodiments, the improvement in the indirect coupling effect is greater than 80 percent.

Figure 4:
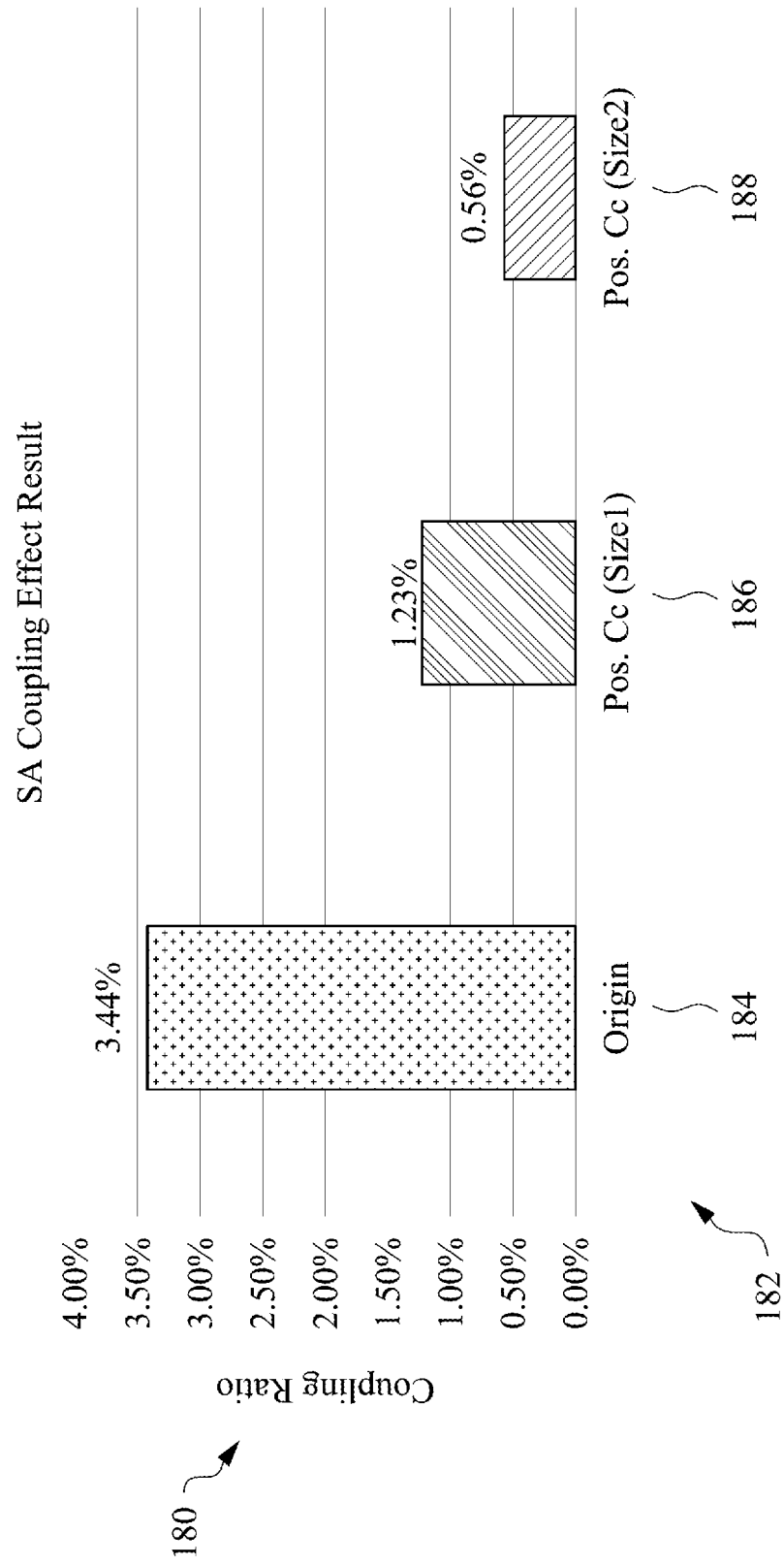
FIG. 4 is a graph diagram illustrating coupling effect results for the sense amplifier of FIG. 3, in accordance with some embodiments.

FIG. 4 is a graph diagram illustrating coupling effect results for the sense amplifier 100, in accordance with some embodiments. The coupling effect results are illustrated as a coupling ratio at 180 with respect to three different configurations of the sense amplifier 100 at 182. In one configuration, at 184, the sense amplifier 100 does not include the cross-coupled capacitors 102 and 104. In another configuration, at 186, the sense amplifier 100 includes cross-coupled capacitors 102 and 104 of one size. In another configuration, at 188, the sense amplifier 100 includes cross-coupled capacitors 102 and 104 of a second size. In some embodiments, the sense amplifier 100 without indirect coupling effects has a read margin of about 10% of the values on the data input Q and the reference input QB.

At 184, the sense amplifier 100 does not include the cross-coupled capacitors 102 and 104 and the in-direct coupling ratio is 3.44%. Thus, the in-direct coupling effect increases the read margin needed to maintain the same reliability in reading the data cells from 10% to 10% plus 3.44%, or 13.44%

At 186, the sense amplifier 100 includes the cross-coupled capacitors 102 and 104 of a first size and the coupling ratio is reduced to 1.23%. Thus, the in-direct coupling effect increases the read margin needed to maintain the same reliability in reading the data cells from 10% to only 10% plus 1.23%, or 11.23%.

At 188, the sense amplifier 100 includes the cross-coupled capacitors 102 and 104 of a first size and the coupling ratio is reduced to 1.23%. This is an improvement of greater than 80%, from 3.44% to 0.56%. Thus, the in-direct coupling effect increases the read margin needed to maintain the same reliability in reading the data cells from 10% to only 10% plus 0.56% or 10.56%.

Figure 5:
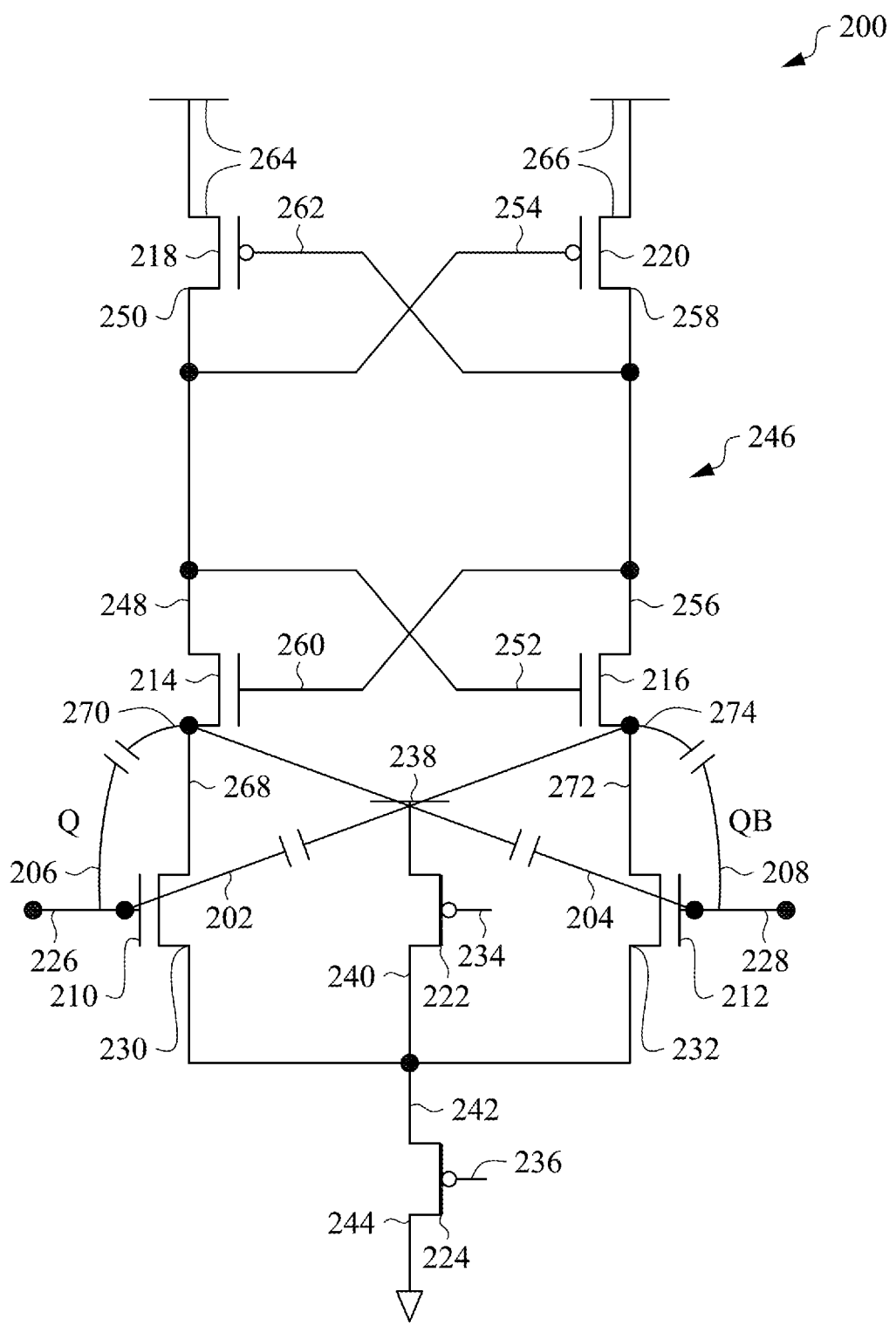
FIG. 5 is a diagram schematically illustrating another sense amplifier that is an NMOS input transistor sense amplifier, in accordance with some embodiments.

FIG. 5 is a diagram schematically illustrating a sense amplifier 200 that is an NMOS input transistor sense amplifier, in accordance with some embodiments. The sense amplifier 200 contributes little or no direct coupling between the data input Q and the reference input QB. Also, the sense amplifier 200 includes positive cross-coupled capacitors 202 and 204 that offset or reduce the negative in-direct coupling caused by internal gate-to-drain/source path capacitors 206 and 208, where the negative in-direct coupling is from internal nodes of the sense amplifier 200 to the data input Q and to the reference input QB. In some embodiments, the sense amplifier 200 is like one or more of the sense amplifiers 24a-24c, shown in FIG. 1. In some embodiments, at least one of the internal capacitors 206 and 208 is a gate-to-drain capacitor. In some embodiments, at least one of the internal capacitors 206 and 208 is a gate-to-source capacitor.

The sense amplifier 200 includes a first input transistor 210, a second input transistor 212, a first latch transistor 214, a second latch transistor 216, a third latch transistor 218, and a fourth latch transistor 220. Each of the first input transistor 210, the second input transistor 212, the first latch transistor 214, and the second latch transistor 216 is an NMOS transistor and each of the third latch transistor 218 and the fourth latch transistor 220 is a PMOS transistor. The sense amplifier 200 further includes a first PMOS enable transistor 222 and a second NMOS enable transistor 224.

The first input transistor 210 has a gate 226 that receives the data input Q from a memory data cell and the second input transistor 212 has a gate 228 that receives the reference input QB, such as the merged reference input QB. One side of the first input transistor's drain/source path is connected at drain/source terminal 230 to one side of the second input transistor's drain/source path at drain/source terminal 232. Also, the first enable transistor 222 has a gate 234 that receives an enable signal and the second enable transistor 224 has a gate 236 that receives the enable signal. In addition, one side of the first enable transistor's drain/source path is connected at drain/source terminal 238 to power and the other side of the first enable transistor's drain/source path is connected at drain source terminal 240 to the drain/source terminals 230 and 232. Further, one side of the second enable transistor's drain/source path is connected at drain/source terminal 242 to the drain/source terminals 230, 232, and 240 and the other side of the second enable transistor's drain/source path is connected at drain/source terminal 244 to a reference, such as ground.

The sense amplifier 200 includes a cross-coupled latch circuit 246 that includes the first latch transistor 214, the second latch transistor 216, the third latch transistor 218, and the fourth latch transistor 220. One side of the first latch transistor's drain/source path is connected at drain/source terminal 248 to one side of the third latch transistor's drain/source path at drain/source terminal 250 and to a gate 252 of the second latch transistor 216 and a gate 254 of the fourth latch transistor 220. One side of the second latch transistor's drain/source path is connected at drain/source terminal 256 to one side of the fourth latch transistor's drain/source path at drain/source terminal 258 and to a gate 260 of the first latch transistor 214 and a gate 262 of the third latch transistor 218. The other side of the third latch transistor's drain/source path is connected at drain/source terminal 264 to power, and the other side of the fourth latch transistor's drain/source path is connected at drain/source terminal 266 to power.

The other side of the first input transistor's drain/source path is connected at drain/source terminal 268 to the other side of the first latch transistor's drain/source path at drain/source terminal 270. Also, the other side of the second input transistor's drain/source path is connected at drain/source terminal 272 to the other side of the second latch transistor's drain/source path at drain/source terminal 274.

The sense amplifier 200 further includes the positive feedback cross-coupled capacitor 202 connected on one side to the gate 226 of the first input transistor 210 and on the other side to the drain/source paths 272 and 274 of the second input transistor 212 and the second latch transistor 216, respectively. The positive feedback cross-coupled capacitor 204 is connected on one side to the gate 228 of the second input transistor 212 and on the other side to the drain/source paths 268 and 270 of the first input transistor 210 and the first latch transistor 214, respectively. Also, the first input transistor 210 includes the internal gate-to-drain/source path capacitor 206 between the gate 226 and the drain/source terminal 268, and the second input transistor 212 includes the internal gate-to-drain/source path capacitor 208 between the gate 228 and the drain/source terminal 272.

In operation, in the pre-charge phase, nodes of the sense amplifier 200 are charged to voltages for reading the data from a data cell at data input Q. In some embodiments, in the pre-charge phase, the sense amplifier 200 is disabled, where the enable signal at the gates 234 and 236 of the first and second enable transistors 222 and 224, respectively, is at a low voltage level, which pulls the node at the drain/source terminal 242 to a high voltage, such as a power voltage. Also, the gate 226 of the first input transistor 210 and the gate 228 of the second input transistor 212 is charged to a low voltage level and, in some embodiments, the gates 260, 252, 262, and 254 of the latch transistors 214, 216, 218, and 220, respectively, are charged to a high voltage level.

Next, in the evaluation phase, the data cell of interest is addressed and the voltage level of the data cell is connected to the pre-charged data input Q. Also, the voltage level from the merged reference cells are connected to the pre-charged reference input QB. If the voltage level from the data cell is a high voltage level, then the data input Q will be driven toward a higher voltage level, such as for reading a 1, and if the voltage level from the data cell is a low voltage level, then the data input Q will be driven toward a low voltage level, such as for reading a 0. In the evaluation phase, one of the data input Q and the reference input QB is higher in voltage than the other one of the data input Q and the reference input QB, such that the one of the input transistors 210 and 212 that receives the higher voltage will be turned on more than the one of the input transistors 210 and 212 that receives the lower voltage, after the sense amplifier 200 is enabled.

In the latch phase, the enable signal at the gates 234 and 236 of the first and second enable transistors 222 and 224, respectively, is switched from a low voltage level to a high voltage level to turn off first enable transistor 222 and turn on second enable transistor 224. This activates the sense amplifier 200, such that the sense amplifier 200 compares the voltage on the data input Q to the voltage on the merged reference input QB to determine the data output Dout. In the latch phase, one of the data input Q and the reference input QB is higher in voltage than the other one of the data input Q and the reference input QB, and the one of the input transistors 210 and 212 that receives the higher voltage is turned on more than the one of the input transistors 210 and 212 that receives the lower voltage.

As a result, one of the drain/source terminals 268 and 272 of the first and second input transistors 210 and 212, respectively, is pulled or charged to a lower voltage faster than the other one. The one of the drain/source terminals 268 and 272 that is charged faster, provides a lower feedback voltage to the input gate of the transistor through its gate-to-drain/source path capacitor, such that the feedback voltage is negative feedback that lowers the higher voltage at the gate and reduces the read margin between the gates 226 and 228 of the first and second input transistors 210 and 212. Also, on the other side of the sense amplifier 200, the one of the drain/source terminals 268 and 272 that is charged slower, provides a higher feedback voltage to the input gate of the transistor through its gate-to-drain/source path capacitor, such that the feedback voltage is negative feedback that raises the lower voltage at the gate and reduces the read margin between the gates 226 and 228 of the first and second input transistors 210 and 212.

To offset or reduce the effect of this negative coupling through the gate-to-drain/source path capacitors 206 and 208, the cross-coupled capacitors 202 and 204 provide positive feedback voltages, i.e., positive coupling, to the gates 226 and 228 of the first and second input transistors 210 and 212. The one of the drain/source terminals 268 and 272 that is pulled lower faster, provides the lower feedback voltage to the input gate of the opposite input transistor through the corresponding one of the cross-coupled capacitors 202 and 204, such that the feedback voltage is a positive feedback that lowers the lower voltage at the gate and increases the read margin between the gates 226 and 228 of the first and second input transistors 210 and 212. Also, on the other side of the sense amplifier 200, the one of the drain/source terminals 268 and 272 that is dis-charged slower, provides the higher feedback voltage to the input gate of the opposite input transistor through the other one of the cross-coupled capacitors 202 and 204, such that the feedback voltage is positive feedback that raises the higher voltage at the gate and increases the read margin between the gates 226 and 228 of the first and second input transistors 210 and 212.

Further, in the latch phase, with the gates 260, 252, 262, and 254 of the latch transistors 214, 216, 218, and 220, respectively, charged to a high voltage level, the first and second latch transistors 214 and 216 are turned on or biased on and the third and fourth latch transistors 218 and 220 are turned off or biased off. The one of the drain/source terminals 268 and 272 that is dis-charged faster, provides the lower voltage through the corresponding one of the first and second latch transistors 214 and 216, which biases off the other one of the first and second latch transistors 214 and 216 and biases on the corresponding one of the third and fourth latch transistors 218 and 220. This, in turn, raise or maintains the higher voltage at the gate of the one of the first and second latch transistors 214 and 216 that is biased on and transmitting the lower voltage from the one of the drain/source terminals 268 and 272 that is dis-charged faster and it raises or maintains the higher voltage at the gate of the corresponding third and fourth latch transistor 218 and 220 to latch in the voltage level of the data cell.

In a memory including sense amplifier 200, factors that can negatively impact the read margin include: data patterns, such as all 0s or all 1s, on data inputs Q changing the merged reference input QB as described above in relation to direct coupling; a capacitance ratio of the gate-to-drain/source path capacitance divided by a gate capacitance at the gate of the input transistor, where a higher capacitance ratio results in a larger in-direct negative coupling problem, and the voltage swing difference between the voltages at the drain/source terminals 268 and 270 and the voltages at the drain/source terminals 272 and 274, which affects the in-direct negative coupling problem through the internal capacitances 206 and 208.

By way of example, in the latch phase, if the voltage on the data input Q is higher than the voltage on reference input QB, the first input transistor 210 turns on more than the second input transistor 212, which lowers the voltage at the drain/source terminals 268 and 270 faster than at the drain/source terminals 272 and 274. Due to in-direct coupling through the internal gate-to-drain/source path capacitor 206, the lower voltage at the drain/source terminals 268 and 270 is fed back through the internal gate-to-drain/source path capacitor 206 to the gate 226 of the first input transistor 210. This in-direct coupling lowers or would lower the voltage of the data input Q on the gate 226, which negatively impacts or reduces the read margin between the voltage of the data input Q and the voltage at the reference input QB. Also, due to in-direct coupling through the internal gate-to-drain/source path capacitor 208, the higher voltage at the drain/source terminals 272 and 274 is fed back through the internal gate-to-drain/source path capacitor 208 to the gate 228 of the second input transistor 212, which may raise the voltage of the reference input QB on the gate 228 and further negatively impact or reduce the read margin between the voltage at the data input Q and the voltage at the reference input QB.

In this example, the lower voltage at the drain/source terminals 268 and 270 is cross-coupled to the gate 228 of the second input transistor 212 to lower or maintain the lower voltage at the reference input QB. Also, the higher voltage on the drain/source terminals 272 and 274 is cross-coupled to the gate 226 of the first input transistor 210 to raise or maintain the higher voltage at the data input Q. Thus, the cross-coupled capacitors 202 and 204 provide positive coupling to the gates 226 and 228 of the first and second input transistors 210 and 212 to increase or maintain the read margin for reading data from the data cell.

Further, in this example, with the gates 260, 252, 262, and 254 of the latch transistors 214, 216, 218, and 220, respectively, charged to a high voltage level, the first and second latch transistors 214 and 216 are turned on or biased on and the third and fourth latch transistors 218 and 220 are turned off or biased off. The lower voltage at the drain/source terminals 268 and 270 is provided through the first latch transistor 214, which biases off the second latch transistor 216 and biases on the fourth latch transistor 220. This, in turn, raise or maintains the higher voltage at the gate 260 of the first latch transistor 214 and at the gate 262 of the third latch transistor 218 to latch in the data from the data cell.

Alternatively, by way of example, in the latch phase, if the voltage on the data input Q is lower than the voltage on the reference input QB, the second input transistor 212 turns on more than the first input transistor 210, which lowers the voltage on the drain/source terminals 272 and 274 faster than on the drain/source terminals 268 and 270. Due to in-direct coupling through the internal gate-to-drain/source path capacitor 208, the lower voltage at the drain/source terminals 272 and 274 is fed back through the internal gate-to-drain/source path capacitor 208 to the gate 228 of the second input transistor 212. This in-direct coupling can lower the voltage at the reference input QB on the gate 228, which negatively impacts or reduces the read margin between the voltage of the data input Q and the voltage at the reference input QB. Also, due to in-direct coupling through the internal gate-to-drain/source capacitor 206, the higher voltage at the drain/source terminals 268 and 270 is fed back through the internal gate-to-drain/source path capacitor 206 to the gate 226 of the first input transistor 210, which raises the voltage at the data input Q on the gate 226 and further negatively impacts or reduces the read margin between the voltage at the data input Q and the voltage at the reference input QB.

In this example, the lower voltage at the drain/source terminals 272 and 274 is cross-coupled to the gate 226 of the first input transistor 210 to lower or maintain the lower voltage at the data input Q. Also, the higher voltage on the drain/source terminals 268 and 270 is cross-coupled to the gate 228 of the second input transistor 212 to raise or maintain the higher voltage at the reference input QB. Thus, the cross-coupled capacitors 202 and 204 provide positive coupling to the gates 226 and 228 of the first and second input transistors 210 and 212 to increase or maintain the read margin for reading data from the data cell.

Further, in this example, with the gates 260, 252, 262, and 254 of the latch transistors 214, 216, 218, and 220, respectively, charged to a high voltage level, the first and second latch transistors 214 and 216 are turned on or biased on and the third and fourth latch transistors 218 and 220 are turned off or biased off. The lower voltage at the drain/source terminals 272 and 274 is provided through the second latch transistor 216, which biases off the first latch transistor 214 and biases on the third latch transistor 218. This, in turn, raises or maintains the higher voltage at the gate 252 of the second latch transistor 216 and at the gate 254 of the fourth latch transistor 220 to latch in the data from the data cell.

Thus, the sense amplifier 200 provides little or no direct coupling between the data input Q and the reference input QB and the sense amplifier 200 reduces in-direct coupling between the data input Q and the reference input QB and internal nodes of the sense amplifier 200. The absence of direct coupling and the reduction in the in-direct coupling improves the read margins and the reliability of the memory. In some embodiments, the improvement in the in-direct coupling effect is provided with little or no impact on the layout area of the circuit and, in some embodiments, the improvement in the indirect coupling effect is greater than 80 percent.

In some embodiments, the cross-coupled capacitors 102 and 104 and the cross-coupled capacitors 202 and 204 include at least one of a FEOL capacitor, a MEOL capacitor, and a BEOL capacitor. Using the FEOL, MEOL, and BEOL capacitors, including existing PODE and ISO-gate structures, results in little or no layout area increases due to including the cross-coupled capacitors 102 and 104 in sense amplifier 100 and the cross-coupled capacitors 202 and 204 in the sense amplifier 200.

Figure 6:
FIG. 6 is a diagram schematically illustrating different capacitors that can be used to provide cross-coupled capacitors in the sense amplifiers, in accordance with some embodiments.

FIG. 6 is a diagram schematically illustrating different capacitors 300 that can be used to provide the cross-coupled capacitors 102 and 104 in sense amplifier 100 and the cross-coupled capacitors 202 and 204 in the sense amplifier 200, in accordance with some embodiments. The capacitors 300 include a PMOS FEOL capacitor 302, an NMOS FEOL capacitor 304, a PMOS FEOL capacitor with a MEOL or BEOL capacitor 306, and a NMOS FEOL capacitor with a MEOL or BEOL capacitor 308.

The PMOS FEOL capacitor 302 includes a PMOS transistor 310 that has its drain and source connected at one terminal 312 and its gate at another terminal 314. The NMOS FEOL capacitor 304 includes an NMOS transistor 316 that has its drain and source connected at one terminal 318 and its gate at another terminal 320.

The PMOS FEOL capacitor with a MEOL or BEOL capacitor 306 includes a PMOS transistor 322 that has its drain and source connected at one terminal 324 and its gate at another terminal 326. Also, a MEOL or BEOL capacitor 328 having one side connected to the one terminal 324 and the other side connected to the other terminal 326. In some embodiments, the capacitor 328 as a MEOL capacitor includes at least one of a MD to MD capacitor, a poly-gate to poly-gate capacitor, a PODE to poly-gate capacitor, a PODE to MD capacitor, and an ISO-gate to MD capacitor. In some embodiments, the capacitor 328 as a BEOL capacitor includes at least one of a metal to metal capacitor and/or metal, such as second layer metal M1 and/or third layer metal M2, coupled to one or more of the MEOL structures.

The NMOS FEOL capacitor with a MEOL or BEOL capacitor 308 includes an NMOS transistor 330 that has its drain and source connected at one terminal 332 and its gate at another terminal 334. Also, a MEOL or BEOL capacitor 336 having one side connected to the one terminal 332 and the other side connected to the other terminal 334. In some embodiments, the capacitor 336 as a MEOL capacitor includes at least one of a MD to MD capacitor, a poly-gate to poly-gate capacitor, a PODE to poly-gate capacitor, a PODE to MD capacitor, and an ISO-gate to MD capacitor. In some embodiments, the capacitor 336 as a BEOL capacitor includes at least one of a metal to metal capacitor and/or metal, such as second layer metal M1 and/or third layer metal M2, coupled to one or more of the MEOL structures.

With each of the different capacitors 300, the terminals of the capacitor are connected to provide the cross-coupled capacitors 102 and 104 in sense amplifier 100 and the cross-coupled capacitors 202 and 204 in the sense amplifier 200.

Figure 7:
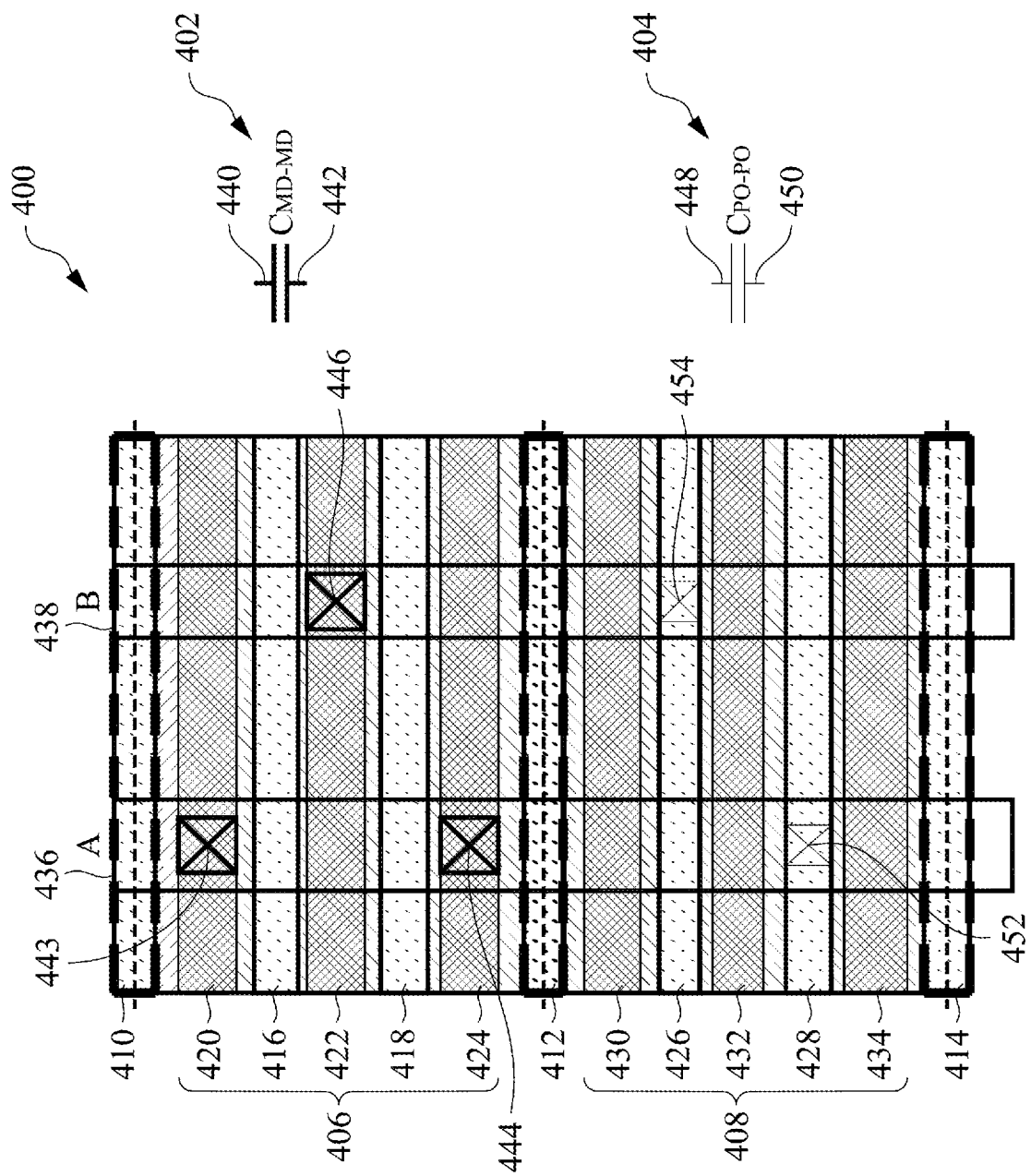
FIG. 7 is a diagram schematically illustrating a portion of an integrated circuit including an MD to MD capacitor and a poly-gate to poly-gate capacitor, in accordance with some embodiments.

FIG. 7 is a diagram schematically illustrating a portion of an integrated circuit 400 including an MD to MD capacitor 402 and a poly-gate to poly-gate capacitor 404, in accordance with some embodiments. In some embodiments, the MEOL/BEOL capacitors 306 and 308 include at least one of the MD to MD capacitor 402 and the poly-gate to poly-gate capacitor 404.

The integrated circuit 400 includes a first active region 406 and a second active region 408. A first PODE 410 is at one end of the first active region 406 and an ISO-gate 412 is at the other end of the first active region 406. The ISO-gate 412 is situated between the first active region 406 and the second active region 408. A second PODE 414 is at the other end of the second active region 408.

The first active region 406 includes a first poly gate 416, a second poly gate 418, a first MD region 420, a second MD region 422, and a third MD region 424. The second active region 408 includes a third poly gate 426, a fourth poly gate 428, a fourth MD region 430, a fifth MD region 432, and a sixth MD region 434. The integrated circuit 400 further includes a first metal track A 436 and a second metal track B 438.

The MD to MD capacitor 402 includes a first terminal 440 and a second terminal 442. The first terminal 440 includes a first via 443 connecting the first MD region 420 to the first metal track A 436 and a second via 444 connecting the third MD region 424 to the first metal track A 436. The second terminal 442 includes a third via 446 connecting the second MD region 422 to the second metal track B 438.

The poly-gate to poly-gate capacitor 404 includes a first poly-gate terminal 448 and a second poly-gate terminal 450. The first poly-gate terminal 448 includes a first via 452 connecting the fourth poly gate 428 to the first metal track A 436. The second poly-gate terminal 450 includes a second via 454 connecting the third poly-gate 426 to the second metal track B 438.

Figure 8:
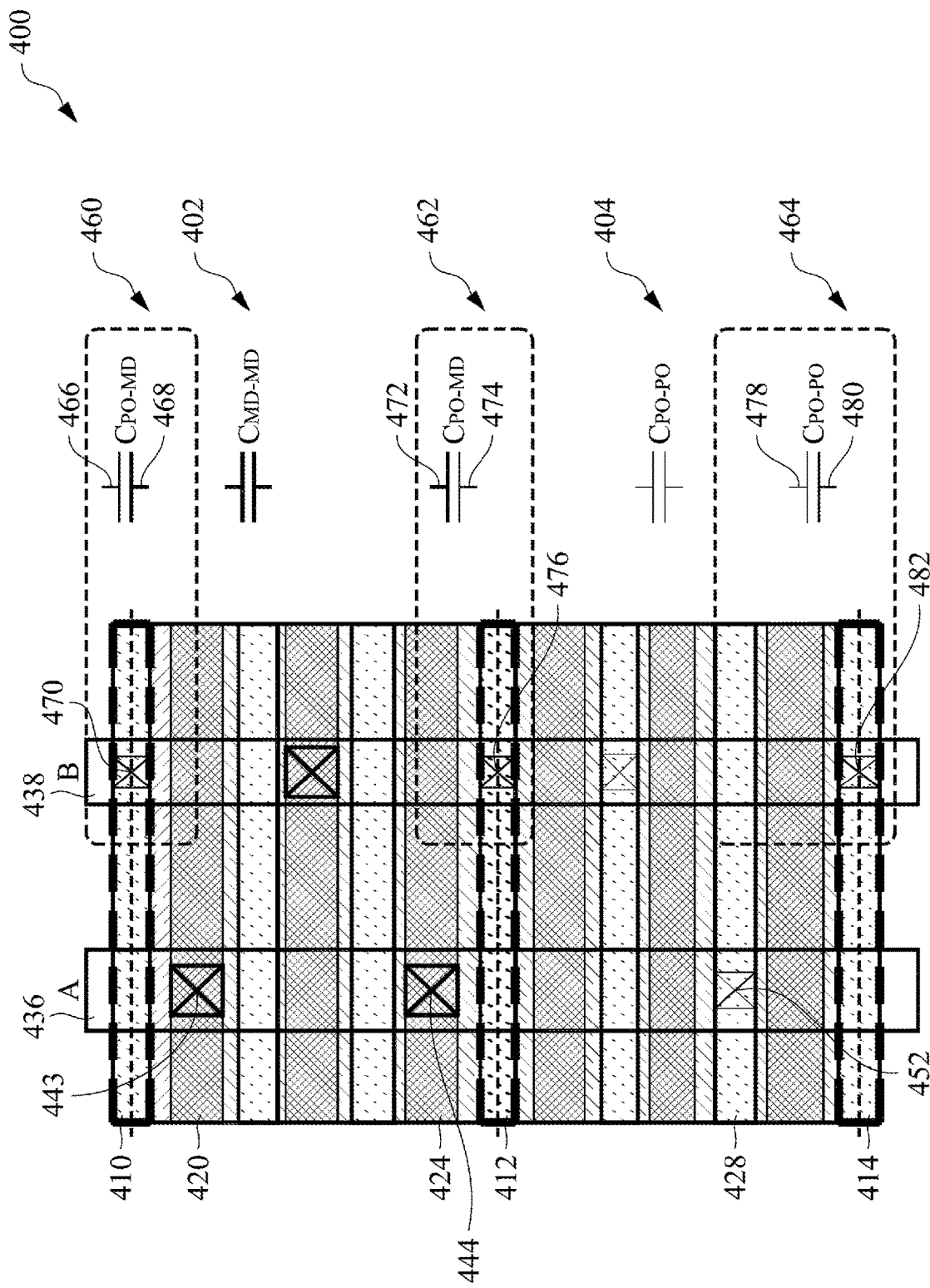
FIG. 8 is a diagram schematically illustrating the portion of the integrated circuit of FIG. 7 further including a PODE to MD capacitor, an ISO-gate to MD capacitor, and a PODE to poly-gate capacitor, in accordance with some embodiments.

FIG. 8 is a diagram schematically illustrating the portion of the integrated circuit 400 further including a PODE to MD capacitor 460, an ISO-gate to MD capacitor 462, and a PODE to poly-gate capacitor 464, in accordance with some embodiments. In some embodiments, the MEOL or BEOL capacitors 306 and 308 include at least one of the PODE to MD capacitor 460, the ISO-gate to MD capacitor 462, and the PODE to poly-gate capacitor 464.

The integrated circuit 400 includes the MD to MD capacitor 402, the poly-gate to poly-gate capacitor 404, and all the elements listed above in relation to FIG. 7, such that they will not be repeated here. The integrated circuit 400 of FIG. 8 further includes the PODE to MD capacitor 460, the ISO-gate to MD capacitor 462, and the PODE to poly-gate capacitor 464.

The PODE to MD capacitor 460 includes a first terminal 466 and a second terminal 468. The first terminal 466 includes a via 470 connecting the first PODE 410 to the second metal track B 438, and the second terminal 468 includes the via 443 connecting the first MD region 420 to the first metal track A 436.

The ISO-gate to MD capacitor 462 includes a first terminal 472 and a second terminal 474. The first terminal 472 includes the via 444 connecting the third MD region 424 to the first metal track A 436, and the second terminal 474 includes a via 476 connecting the ISO-gate 412 to the second metal track B 438.

The PODE to poly-gate capacitor 464 includes a first terminal 478 and a second terminal 480. The first terminal 478 includes via 452 connecting the fourth poly gate 428 to the first metal track A 436, and the second poly-gate terminal 480 includes a via 482 connecting the second PODE 414 to the second metal track B 438.

Each of the MD to MD capacitor 402, the poly-gate to poly-gate capacitor 404, the PODE to MD capacitor 460, the ISO-gate to MD capacitor 462, and the PODE to poly-gate capacitor 464 can be connected to provide at least part of one or more of the cross-coupled capacitors 102 and 104 in sense amplifier 100 and the cross-coupled capacitors 202 and 204 in the sense amplifier 200.

Figure 9:
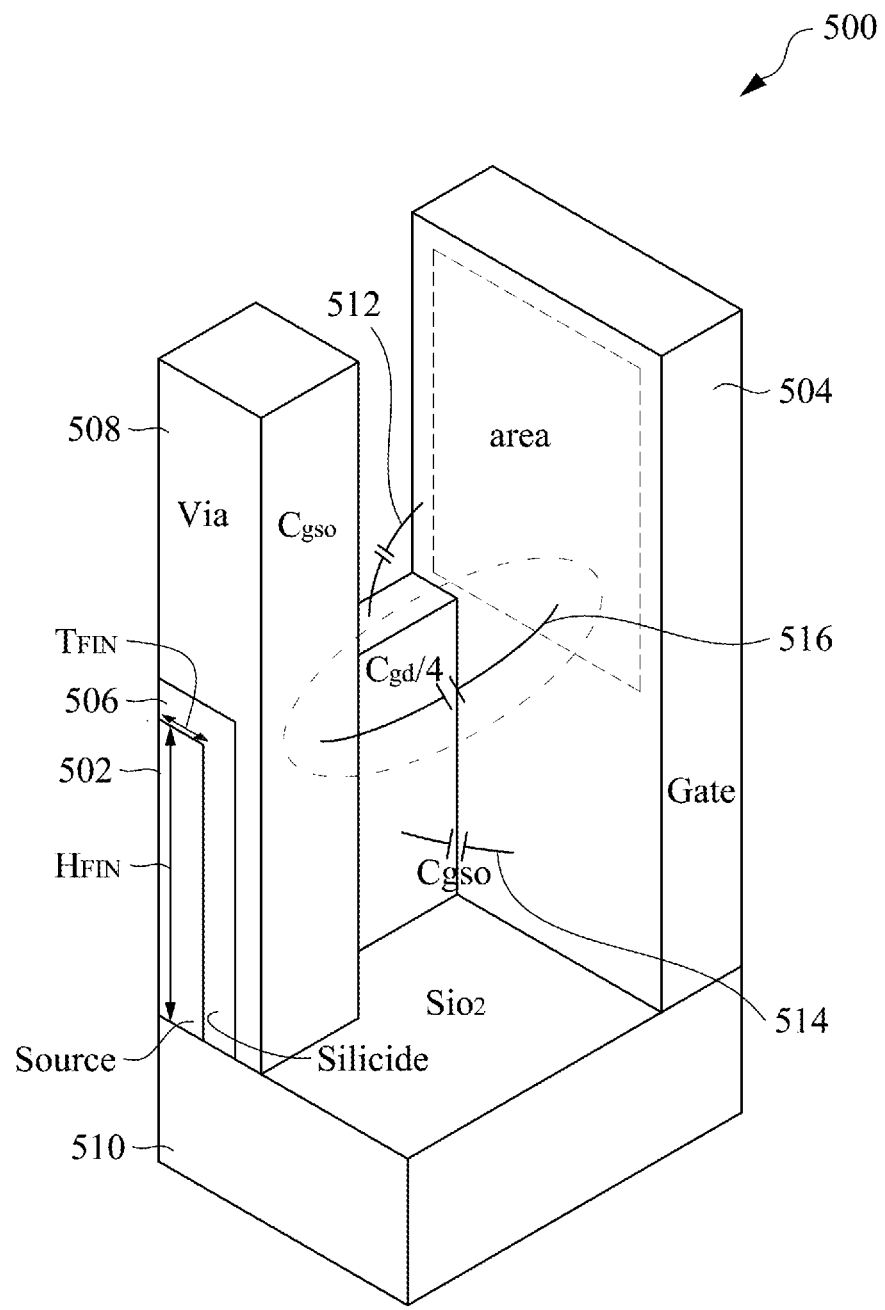
FIG. 9 is a diagram schematically illustrating a fin field-effect-transistor (finfet) structure, in accordance with some embodiments.

FIG. 9 is a diagram schematically illustrating a finfet structure 500, in accordance with some embodiments. The finfet structure 500 is a MEOL capacitor that can be connected to provide at least part of one or more of the cross-coupled capacitors 102 and 104 in sense amplifier 100 and the cross-coupled capacitors 202 and 204 in the sense amplifier 200.

The finfet structure 500 includes a fin 502, which in this example is a source, and a poly gate 504. The fin 502 has a height H and a thickness or width T. Silicide 506 is disposed on the fin 502 for contacting a via or MD 508. In some embodiments, the MD 508 is first layer metal M0 disposed on the silicide 506.

The poly gate 504 is a dummy gate that is not connected for finfet operation. The fin 502 and the poly gate 504 are situated on a substrate 510 of silicon dioxide. In some embodiments, the poly gate 504 is a PODE. In some embodiments, the poly gate 504 is an ISO-gate structure.

Situated between the poly gate 504 and the fin 502 are gate-to-source capacitors 512 and 514. Also, situated between the MD 508 and the poly gate 504 is a poly gate to MD capacitor 516. The metal of the MD 508 and the area of the poly gate 504 make the poly gate to MD capacitor 516 larger.

To connect the finfet structure 500 to be at least part of the cross-coupled capacitor 102, one of the poly gate 504 and the MD 508 is connected to gate 126 of the first input transistor 110 and the other one of the poly gate 504 and the MD 508 is connected to the drain/source terminals 172 and 174 of the second input transistor 112 and the second latch transistor 116. To connect the finfet structure 500 to be at least part of the cross-coupled capacitor 104, one of the poly gate 504 and the MD 508 is connected to the gate 128 of the second input transistor 112 and the other one of the poly gate 504 and the MD 508 is connected to the drain/source terminals 168 and 170 of the first input transistor 110 and the first latch transistor 114.

To connect the finfet structure 500 to be at least part of the cross-coupled capacitor 202, one of the poly gate 504 and the MD 508 is connected to gate 226 of the first input transistor 210 and the other one of the poly gate 504 and the MD 508 is connected to the drain/source terminals 272 and 274 of the second input transistor 212 and the second latch transistor 216. To connect the finfet structure 500 to be at least part of the cross-coupled capacitor 204, one of the poly gate 504 and the MD 508 is connected to the gate 228 of the second input transistor 212 and the other one of the poly gate 504 and the MD 508 is connected to the drain/source terminals 268 and 270 of the first input transistor 210 and the first latch transistor 214.

Figure 10:
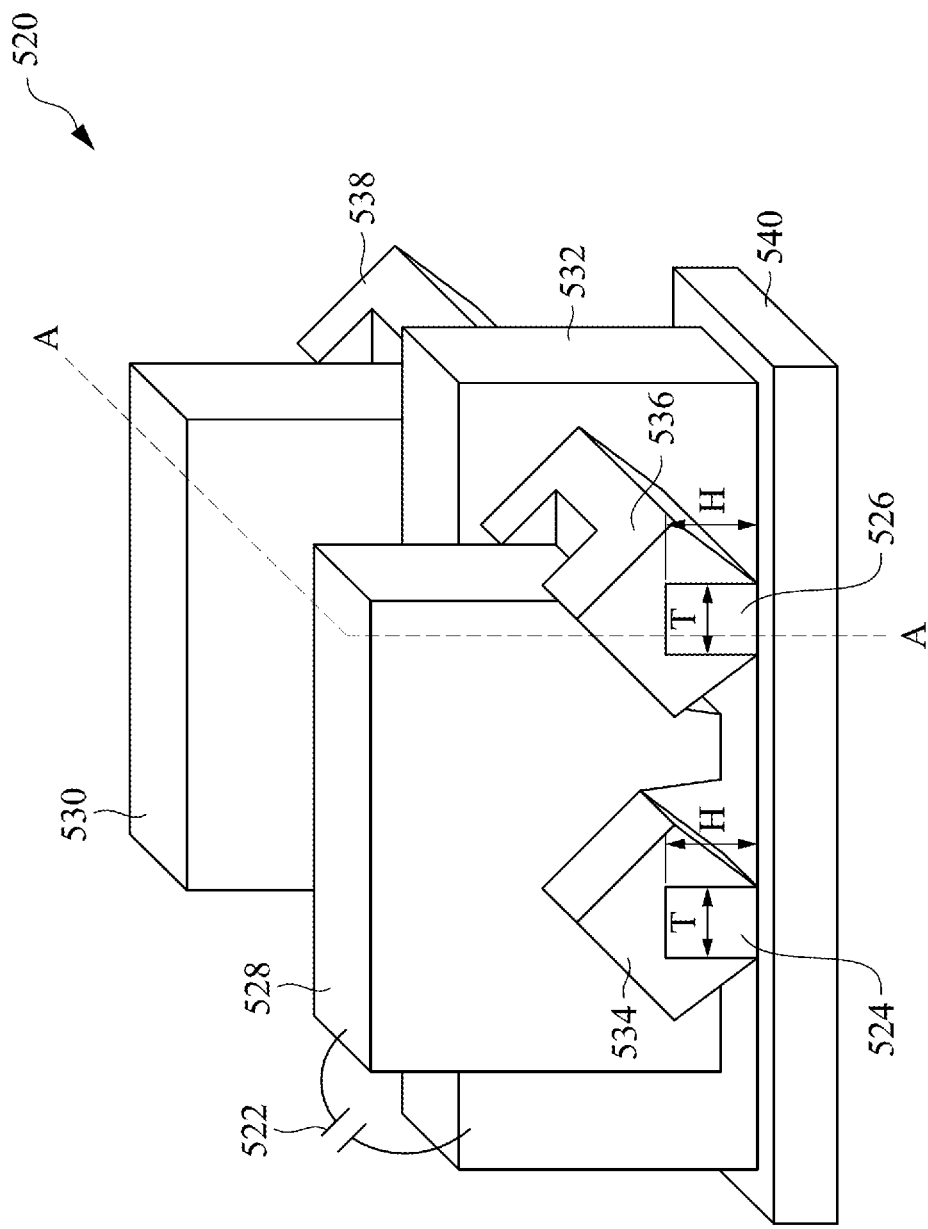
FIG. 10 is diagram schematically illustrating a perspective view of a finfet structure, in accordance with some embodiments.
Figure 11:
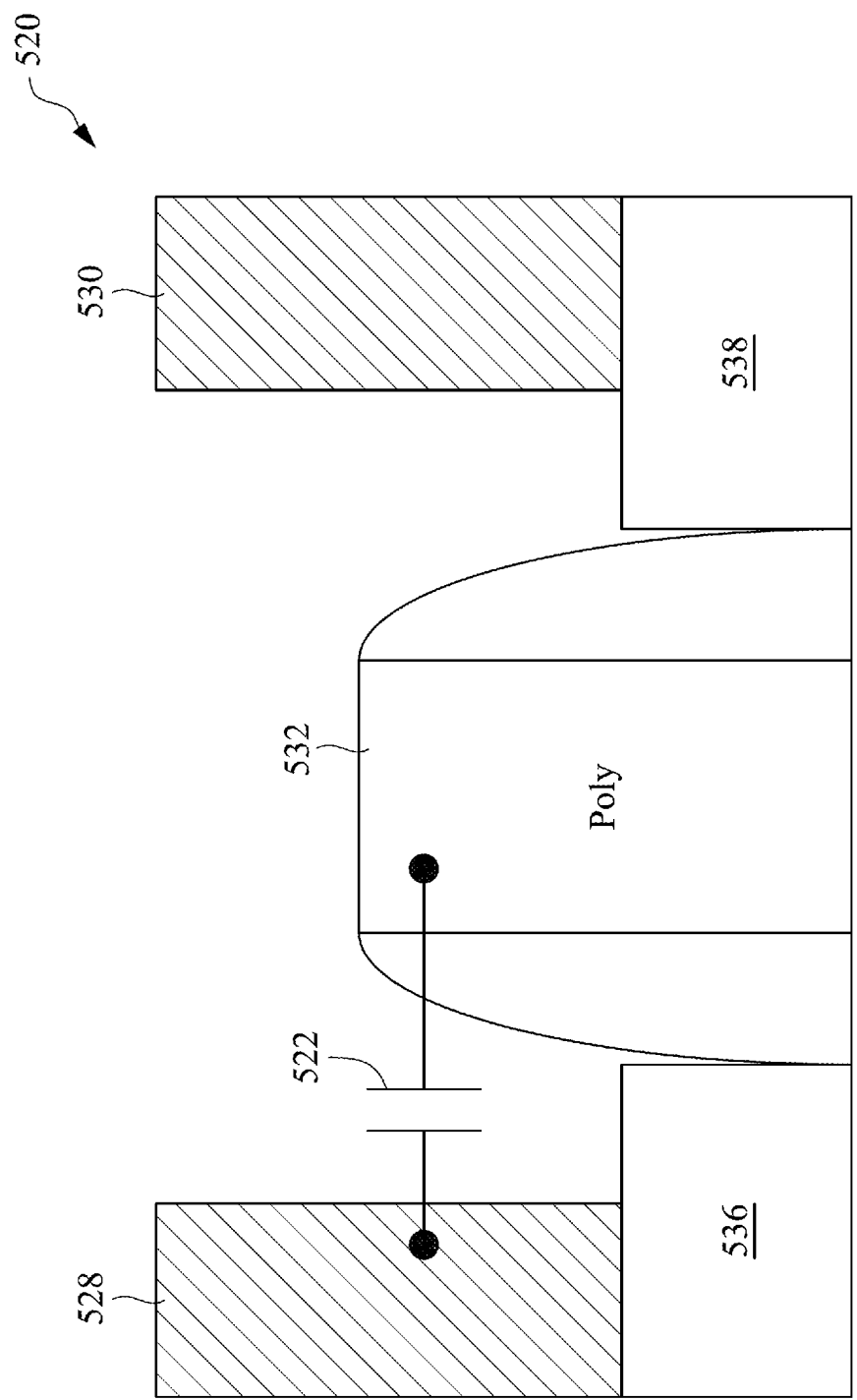
FIG. 11 is a diagram schematically illustrating a partial cross-section of a finfet structure, in accordance with some embodiments.

FIGS. 10 and 11 are diagrams schematically illustrating a finfet structure 520 having a poly gate to MD capacitor 522, in accordance with some embodiments. The finfet structure 520 is configured to be a MEOL capacitor that can be connected to provide at least part of one or more of the cross-coupled capacitors 102 and 104 in sense amplifier 100 and the cross-coupled capacitors 202 and 204 in the sense amplifier 200.

FIG. 10 is diagram schematically illustrating a perspective view of the finfet structure 520, in accordance with some embodiments, and FIG. 11 is a diagram schematically illustrating a partial cross-section of the finfet structure 520 along the line A-A in FIG. 10, in accordance with some embodiments.

The finfet structure 520 includes fins 524 and 526, MDs 528 and 530, a poly gate 532, and fin contacts 534, 536, and 538. Each of the fins 524 and 526 has a height H and a thickness T. The fin contacts 534 and 536 are disposed on the fins 524 and 526, respectively, and the MD 528 is situated on the fin contacts 534 and 536 to make electrical contact with the fins 524 and 526. The fins 524 and 526 and the poly gate 532 are situated on a substrate 540, such as a silicon dioxide substrate. In some embodiments, each of the MDs 528 and 530 includes first layer metal M0. In other embodiments, the poly gate 532 can be a PODE or an ISO-gate structure.

The poly gate 532 is a dummy gate that is not connected for finfet operation. Situated between the poly gate 532 and the MD 528 is the poly gate to MD capacitor 522. The metal of the MD 528 and the area of the poly gate 532 makes the poly gate to MD capacitor 522 larger.

To connect the finfet structure 520 to be at least part of the cross-coupled capacitor 102, one of the poly gate 532 and the MD 528 is connected to gate 126 of the first input transistor 110 and the other one of the poly gate 532 and the MD 528 is connected to the drain/source terminals 172 and 174 of the second input transistor 112 and the second latch transistor 116. To connect the finfet structure 520 to be at least part of the cross-coupled capacitor 104, one of the poly gate 532 and the MD 528 is connected to the gate 128 of the second input transistor 112 and the other one of the poly gate 532 and the MD 528 is connected to the drain/source terminals 168 and 170 of the first input transistor 110 and the first latch transistor 114.

To connect the finfet structure 520 to be at least part of the cross-coupled capacitor 202, one of the poly gate 532 and the MD 528 is connected to gate 226 of the first input transistor 210 and the other one of the poly gate 532 and the MD 528 is connected to the drain/source terminals 272 and 274 of the second input transistor 212 and the second latch transistor 216. To connect the finfet structure 520 to be at least part of the cross-coupled capacitor 204, one of the poly gate 532 and the MD 528 is connected to the gate 228 of the second input transistor 212 and the other one of the poly gate 532 and the MD 528 is connected to the drain/source terminals 268 and 270 of the first input transistor 210 and the first latch transistor 214.

Figure 12:
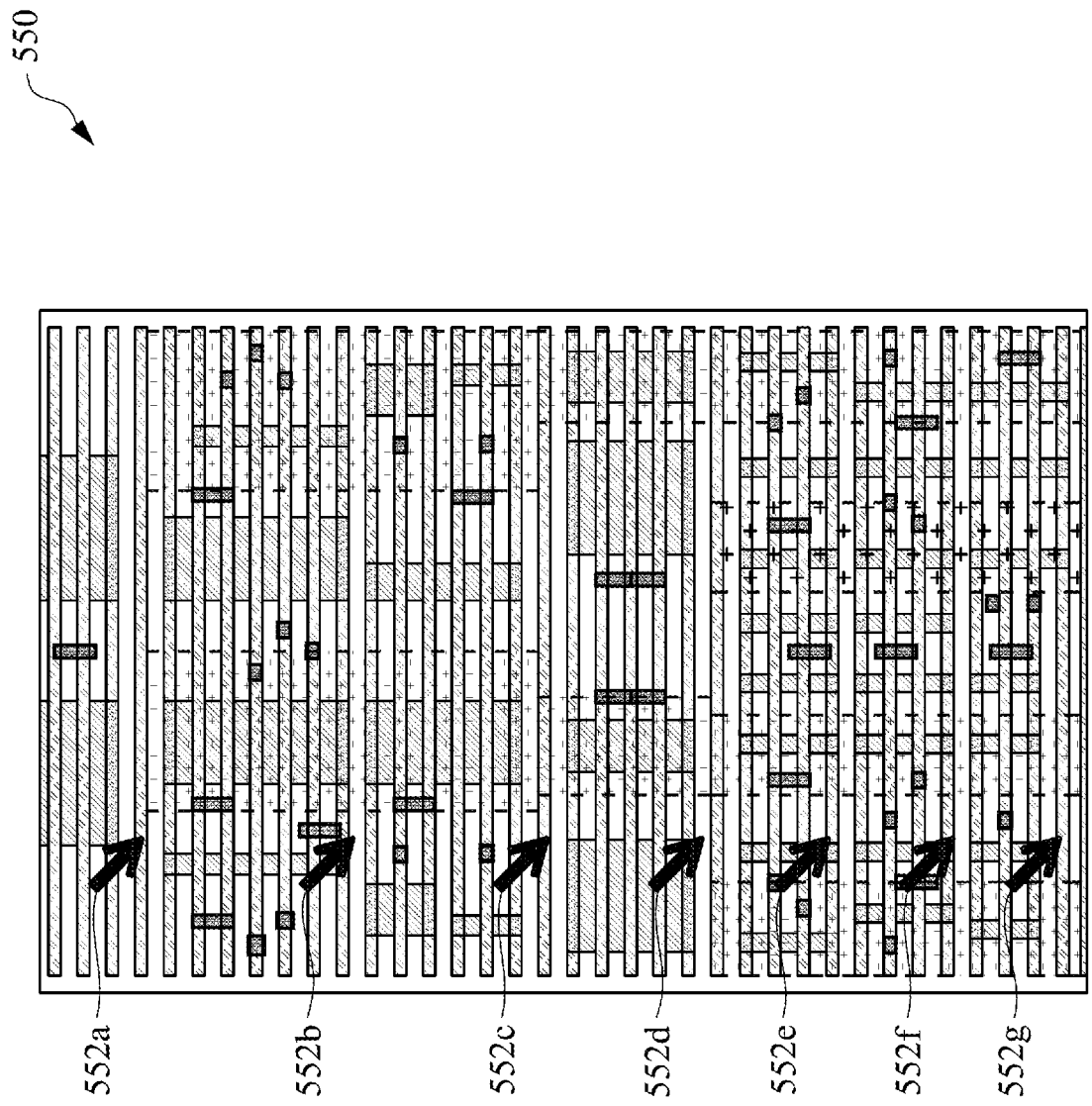
FIG. 12 is a diagram schematically illustrating a portion of an integrated circuit including multiple dummy poly structures, in accordance with some embodiments.

FIG. 12 is a diagram schematically illustrating a portion of an integrated circuit 550 including multiple dummy poly structures 552*a*-552*g*, in accordance with some embodiments. In some embodiments, at least one of the dummy poly structures 552*a*-552*g* is a dummy gate that is not used to operate a transistor. In some embodiments, at least one of the dummy poly structures 552a-552g is a PODE, such as first PODE 410 and second PODE 414 shown in FIGS. 7 and 8. In some embodiments, at least one of the dummy poly structures 552a-552g is an ISO-gate, such as ISO-gate 412 shown in FIGS. 7 and 8.

The dummy poly structures 552a-552g can be used to provide MEOL capacitors. In some embodiments, the dummy poly structures 552a-552g are used to provide the finfet structure 500. In some embodiments, the dummy poly structures 552a-552g are used to provide the finfet structure 520. In some embodiments, the dummy poly structures 552a-552g are used to provide at least one of the PODE to MD capacitor 460, the ISO-gate to MD capacitor 462, and the PODE to poly-gate capacitor 464 shown in FIGS. 7 and 8. In some embodiments, the dummy poly structures 552a-552g are used to provide at least one of the PMOS FEOL capacitor with a MEOL or BEOL capacitor 306 and the NMOS FEOL capacitor with a MEOL or BEOL capacitor 308.

Using the dummy polys 552a-552g to provide MEOL capacitors results in little or no impact on the layout area of circuits, such as little or no layout area increases for the sense amplifiers 100 and 200, since the dummy polys 552a-552g are already in the integrated circuit 550.

Figure 13:
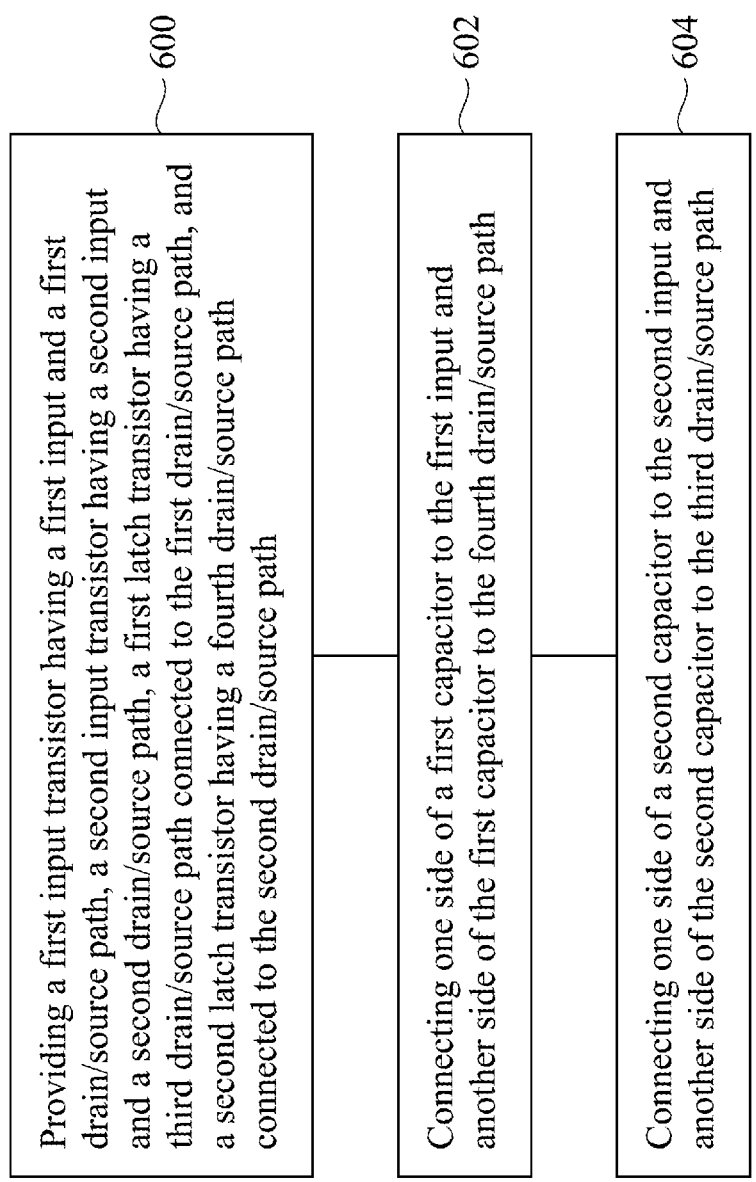
FIG. 13 is a flow-chart diagram schematically illustrating a method, in accordance with some embodiments.

FIG. 13 is a flow-chart diagram schematically illustrating a method to offset or reduce negative in-direct coupling effects in a sense amplifier, in accordance with some embodiments. At 600, the method includes providing a first input transistor having a first input and a first drain/source path, such as input transistor 110 having gate 126 and a drain/source path from drain/source terminal 130 to drain/source terminal 168 (shown in FIG. 3), a second input transistor having a second input and a second drain/source path, such as input transistor 112 having gate 128 and a drain/source path from drain/source terminal 132 to drain/source terminal 172, a first latch transistor having a third drain/source path from drain/source terminal 170 to drain/source terminal 148 connected to the first drain/source path, and a second latch transistor having a fourth drain/source path from drain/source terminal 174 to drain/source terminal 156 connected to the second drain/source path.

At 602, the method includes connecting one side of a first capacitor, such as capacitor 102, to the first input and another side of the first capacitor to the fourth drain/source path and, in some embodiments, at 604, the method includes connecting one side of a second capacitor, such as capacitor 104, to the second input and another side of the second capacitor to the third drain/source path.

In some embodiments, the method includes connecting a drain and a source of a transistor to a first terminal and a gate of the transistor to a second terminal, such as in transistors 310 and 316 (shown in FIG. 6), and connecting the first terminal to one of the first input and the fourth drain/source path and the second terminal to the other one of the first input and the fourth drain/source path, where in some embodiments this is at least part of forming the first capacitor, such as capacitor 102, and in some embodiments this is at least part of forming the second capacitor, such as capacitor 104.

In some embodiments, the method includes connecting at least one of a metal over diffusion to metal over diffusion capacitor, a polycrystalline silicon gate to polycrystalline silicon gate capacitor, a polycrystalline silicon on oxide diffusion edge gate to polycrystalline silicon gate capacitor, a polycrystalline silicon on oxide diffusion edge gate to metal over diffusion capacitor, and an isolation polycrystalline silicon gate to metal over diffusion capacitor between and to the first input and the fourth drain/source path, where in some embodiments this is at least part of forming the first capacitor, such as capacitor 102, and in some embodiments this is at least part of forming the second capacitor, such as capacitor 104.

Disclosed embodiments thus provide sense amplifiers and methods that include a first input transistor having a data input QB at its gate and a second input transistor having a reference input QB at its gate. The first and second input transistors are connected to a latch circuit, with the drain/source path of the first input transistor connected to the drain/source path of a first latch transistor, and the drain/source path of the second input transistor connected to the drain/source path of a second latch transistor. The first input transistor includes an internal coupling capacitor from its gate to the drain/source connection with the first latch transistor, and the second input transistor includes an internal coupling capacitor from its gate to the drain/source connection with the second latch transistor. To offset or reduce the negative in-direct coupling effects from these internal coupling capacitors, the sense amplifier includes cross-coupled capacitors that provide positive coupling effects on the data input Q and the reference input QB. In some embodiments, the improvement in the indirect coupling effect is greater than 80 percent.

In some embodiments, the cross-coupled capacitors include at least one of an FEOL capacitor, a MEOL capacitor, and a BEOL capacitor. In some embodiments, the FEOL capacitors include a mosfet having its drain and source connected at one terminal and its gate at another terminal. In some embodiments, the MEOL capacitors include at least one of a MD to MD capacitor, a poly-gate to poly-gate capacitor, a PODE to poly-gate capacitor, a PODE to MD capacitor, and an ISO-gate to MD capacitor. Using dummy gates that are already in the integrated circuit to form the cross-coupled capacitors results in little or no layout area increase for the sense amplifier.

Disclosed embodiments thus provide sense amplifiers that provide little or no direct coupling effect between the data input Q and the reference input QB and that reduce the in-direct coupling effect on the data input Q and the reference input QB from internal nodes of the sense amplifier. The absence of direct coupling and the reduction in the in-direct coupling improves the read margin and the reliability of the memory.

In accordance with some embodiments, a device includes a first input transistor having a first input gate and a first drain/source terminal, a second input transistor having a second input gate and a second drain/source terminal, a latch circuit, and a first capacitor. The latch circuit includes a first latch transistor having a third drain/source terminal connected to the first drain/source terminal and a second latch transistor having a fourth drain/source terminal connected to the second drain/source terminal. The first capacitor is connected on one side to the first input gate and on another side to the fourth drain/source terminal.

In accordance with further embodiments, a device includes a first input transistor having a first input and a first drain/source path, a second input transistor having a second input and a second drain/source path, a latch circuit, a first capacitor, and a second capacitor. The latch circuit includes a first latch transistor having a third drain/source path connected to the first drain/source path, a second latch transistor having a fourth drain/source path connected to the second drain/source path, a third latch transistor having a fifth drain/source path connected to the third drain/source path and to one of power and a reference, and a fourth latch transistor having a sixth drain/source path connected to the fourth drain/source path and to one of the power and the reference. The first capacitor is connected on one side to the first input and on another side to the fourth drain/source path, and the second capacitor is connected on one side to the second input and on another side to the third drain/source path, wherein at least one of the first capacitor and the second capacitor includes at least one of a transistor capacitor having a drain and a source connected at a first terminal and a gate at a second terminal and a middle-end-of-line capacitor.

In accordance with still further disclosed aspects, a method includes providing a first input transistor having a first input and a first drain/source path, a second input transistor having a second input and a second drain/source path, a first latch transistor having a third drain/source path connected to the first drain/source path, and a second latch transistor having a fourth drain/source path connected to the second drain/source path, and connecting one side of a first capacitor to the first input and another side of the first capacitor to the fourth drain/source path.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first input transistor having a first input gate and a first drain/source terminal;
    a second input transistor having a second input gate and a second drain/source terminal;
    a latch circuit including:
        a first latch transistor having a third drain/source terminal connected to the first drain/source terminal; and
        a second latch transistor having a fourth drain/source terminal connected to the second drain/source terminal; and
    at least two capacitors connected in parallel, the at least two capacitors including:
        a first transistor capacitor having a drain and a source connected at a first terminal and a gate at a second terminal, wherein the first terminal is connected to one of the first input gate and the fourth drain/source terminal and the second terminal is connected to the other one of the first input gate and the fourth drain/source terminal; and
        a first metal over diffusion to metal over diffusion capacitor including:
            a first metal over diffusion layer connected to a first metal layer line; and
            a second metal over diffusion layer connected to a second metal layer line,
            wherein the first metal layer line is connected to one of the first input gate and the fourth drain/source terminal and the second metal layer line is connected to the other one of the first input gate and the fourth drain/source terminal.

2. The device of claim 1, wherein the at least two capacitors include another capacitor that is one of a middle-end-of-line capacitor and a back-end-of-line capacitor which are connected on one side to the first terminal and on another side to the second terminal of the transistor capacitor.

3. The device of claim 1, comprising at least one capacitor connected on one side to the second input and on another side to the third drain/source terminal.

4. The device of claim 3, wherein the at least one capacitor includes a second transistor capacitor having a drain and a source connected at a first terminal and a gate at a second terminal, wherein the first terminal is connected to one of the second input gate and the third drain/source terminal and the second terminal is connected to the other one of the second input gate and the third drain/source terminal.

5. The device of claim 4, wherein the at least one capacitor includes at least one of a middle-end-of-line capacitor and a back-end-of-line capacitor which are connected on one side to the first terminal and on another side to the second terminal of the transistor capacitor.

6. The device of claim 1, wherein the at least two capacitors include other capacitors including at least one of a middle-end-of-line capacitor and a back-end-of-line capacitor.

7. The device of claim 1, wherein the at least two capacitors include a second metal over diffusion to metal over diffusion capacitor.

8. The device of claim 1, wherein the at least two capacitors include a polycrystalline silicon gate to polycrystalline silicon gate capacitor.

9. The device of claim 1, wherein the at least two capacitors include at least one of a polycrystalline silicon on oxide diffusion edge gate to polycrystalline silicon gate capacitor and a polycrystalline silicon on oxide diffusion edge gate to metal over diffusion capacitor.

10. The device of claim 1, wherein the at least two capacitors include an isolation polycrystalline silicon gate to metal over diffusion capacitor.

11. A device, comprising:
    a first input transistor having a first input and a first drain/source path;
    a second input transistor having a second input and a second drain/source path;
    a latch circuit including:
    a first latch transistor having a third drain/source path connected to the first drain/source path;
    a second latch transistor having a fourth drain/source path connected to the second drain/source path;
    a third latch transistor having a fifth drain/source path connected to the third drain/source path and to one of power and a reference; and
    a fourth latch transistor having a sixth drain/source path connected to the fourth drain/source path and to one of the power and the reference;
    a first metal over diffusion to metal over diffusion capacitor including:
        a first metal over diffusion layer connected to a first metal layer line; and
        a second metal over diffusion layer connected to a second metal layer line,
        wherein the first metal layer line is connected to one of the first input and the fourth drain/source path and the second metal layer line is connected to the other one of the first input and the fourth drain/source path; and a second metal over diffusion to metal over diffusion capacitor including:
a third metal over diffusion layer connected to a third metal layer line; and
a fourth metal over diffusion layer connected to a fourth metal layer line,
wherein the third metal layer line is connected to one of the second input and the third drain/source path and the fourth metal layer line is connected to the other one of the second input and the third drain/source path.

12. The device of claim 11, comprising a first transistor capacitor having a drain and a source connected at a first terminal and a gate at a second terminal, wherein the first terminal is connected to one of the first input and the fourth drain/source path and the second terminal is connected to the other one of the first input and the fourth drain/source path.

13. The device of claim 12, comprising a second transistor capacitor having a drain and a source connected at a first terminal and a gate at a second terminal, wherein the first terminal is connected to one of the second input and the third drain/source path and the second terminal is connected to the other one of the second input and the third drain/source path.

14. The device of claim 11, comprising a polycrystalline silicon gate to polycrystalline silicon gate capacitor that is connected to the first input and the fourth drain/source path.

15. The device of claim 11, comprising at least one of a polycrystalline silicon on oxide diffusion edge gate to polycrystalline silicon gate capacitor, a polycrystalline silicon on oxide diffusion edge gate to metal over diffusion capacitor, and an isolation polycrystalline silicon gate to metal over diffusion capacitor connected to the first input and the fourth drain/source path.

16. A method, comprising:
providing a first input transistor having a first input and a first drain/source path;
providing a second input transistor having a second input and a second drain/source path;
connecting a third drain/source path of a first latch transistor to the first drain/source path;
connecting a fourth drain/source path of a second latch transistor to the second drain/source path;
connecting a first transistor capacitor having a drain and a source connected at a first terminal and a gate at a second terminal, wherein the first terminal is connected to one of the first input and the fourth drain/source path and the second terminal is connected to the other one of the first input and the fourth drain/source path; and
connecting a metal over diffusion to metal over diffusion capacitor including:
a first metal over diffusion layer connected to a first metal layer line; and
a second metal over diffusion layer connected to a second metal layer line,
wherein the first metal layer line is connected to one of the first input and the fourth drain/source path and the second metal layer line is connected to the other one of the first input and the fourth drain/source path.

17. The method of claim 16, comprising connecting one side of at least one other capacitor to the second input and another side of the at least one other capacitor to the third drain/source path.

18. The method of claim 16, comprising:
connecting a second transistor capacitor having a drain and a source connected at a first terminal and a gate at a second terminal by connecting the first terminal to one of the second input and the third drain/source path and the second terminal to the other one of the second input and the third drain/source path.

19. The method of claim 16, comprising connecting at least one of a polycrystalline silicon gate to polycrystalline silicon gate capacitor, a polycrystalline silicon on oxide diffusion edge gate to polycrystalline silicon gate capacitor, a polycrystalline silicon on oxide diffusion edge gate to metal over diffusion capacitor, and an isolation polycrystalline silicon gate to metal over diffusion capacitor between and to the first input and the fourth drain/source path.

\* \* \* \* \*